(12) United States Patent
Murai et al.

(10) Patent No.: US 8,198,140 B2
(45) Date of Patent: Jun. 12, 2012

(54) WIRING SUBSTRATE FOR MOUNTING SEMICONDUCTORS, METHOD OF MANUFACTURING THE SAME, AND SEMICONDUCTOR PACKAGE

(75) Inventors: Hideya Murai, Tokyo (JP); Tadanori Shimoto, Tokyo (JP); Takuo Funaya, Tokyo (JP); Katsumi Kikuchi, Tokyo (JP); Shintaro Yamamichi, Tokyo (JP); Kazuhiro Baba, Tokyo (JP); Hirokazu Honda, Kanagawa (JP); Keiichiro Kata, Kanagawa (JP); Kouji Matsui, Tokyo (JP); Shinichi Miyazaki, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 20 days.

(21) Appl. No.: 12/882,277

(22) Filed: Sep. 15, 2010

(65) Prior Publication Data
US 2011/0003472 A1  Jan. 6, 2011

Related U.S. Application Data

(62) Division of application No. 11/174,526, filed on Jul. 6, 2005, now Pat. No. 7,816,782.

(30) Foreign Application Priority Data

Jul. 7, 2004  (JP) ................................ 2004-200774
May 11, 2005  (JP) ................................ 2005-138450

(51) Int. Cl.
*H01L 21/44* (2006.01)
*H01L 21/48* (2006.01)

(52) U.S. Cl. ... 438/125; 438/666; 438/667; 257/E21.538
(58) Field of Classification Search .................. 438/125, 438/666, 667; 257/E23.09, 702, 21.538
See application file for complete search history.

(56) References Cited

U.S. PATENT DOCUMENTS

| | | | |
|---|---|---|---|
| 5,688,408 A * | 11/1997 | Tsuru et al. | 216/17 |
| 5,998,291 A * | 12/1999 | Bakhit et al. | 438/618 |
| 6,020,561 A | 2/2000 | Ishida et al. | |
| 6,239,983 B1 | 5/2001 | Shingai et al. | |
| 6,324,067 B1 | 11/2001 | Nishiyama | |
| 6,351,031 B1 | 2/2002 | Iijima et al. | |
| 6,739,040 B1 * | 5/2004 | Nakamura et al. | 29/830 |
| 6,784,530 B2 | 8/2004 | Sugaya et al. | |
| 6,867,493 B2 | 3/2005 | Hashemi et al. | |
| 6,943,442 B2 | 9/2005 | Sunohara et al. | |
| 8,008,130 B2 * | 8/2011 | Honda | 438/122 |

(Continued)

FOREIGN PATENT DOCUMENTS

JP  05-37159 A  2/1993

(Continued)

*Primary Examiner* — Nitin Parekh
(74) *Attorney, Agent, or Firm* — Sughrue Mion, PLLC

(57) ABSTRACT

A wiring substrate for mounting semiconductors is provided with an insulation film, wires formed in the insulation film, and a plurality of electrode pads that electrically connect to the wires through vias. The electrode pads are provided to have their surfaces exposed to both of the front surface and the rear surface of the insulation film, and at least a part of the side surface of the electrode pads is buried in the insulation film. The insulation film is formed by forming electrode pads on the respective two metallic plates, thereafter, laminating an insulation layer and wires on the respective metallic plates to cover the electrode pad, and adhering the insulation layers to each other for integration, and thereafter, removing the metallic plates.

12 Claims, 17 Drawing Sheets

U.S. PATENT DOCUMENTS

| | | |
|---|---|---|
| 2003/0124767 A1* | 7/2003 | Lee et al. .................. 438/107 |
| 2003/0145458 A1* | 8/2003 | Tani et al. .................. 29/830 |
| 2004/0012085 A1 | 1/2004 | Shioga et al. |
| 2004/0053489 A1 | 3/2004 | Kata et al. |
| 2004/0195686 A1 | 10/2004 | Jobetto et al. |
| 2005/0006744 A1 | 1/2005 | Ooi et al. |
| 2005/0146038 A1 | 7/2005 | Muramatsu et al. |

FOREIGN PATENT DOCUMENTS

| | | |
|---|---|---|
| JP | 05-144974 A | 6/1993 |
| JP | 06-296081 A | 10/1994 |
| JP | 06-318783 A | 11/1994 |
| JP | 07-170071 A | 7/1995 |
| JP | 10-116857 A | 5/1998 |
| JP | 2000-277889 A | 10/2000 |
| JP | 2001-007529 A | 1/2001 |
| JP | 2001-053198 A | 2/2001 |
| JP | 2001-284783 A | 10/2001 |
| JP | 2002-026171 A | 1/2002 |
| JP | 2002-083893 A | 3/2002 |
| JP | 2002-190549 A | 7/2002 |
| JP | 2002-198462 A | 7/2002 |
| JP | 2002-329949 A | 11/2002 |
| JP | 2003-17834 A | 1/2003 |
| JP | 2003-347459 A | 5/2003 |
| JP | 2003-282773 A | 10/2003 |
| JP | 2003-289104 A | 10/2003 |
| JP | 2003-347738 A | 12/2003 |
| JP | 2004-064082 A | 2/2004 |
| JP | 2004-079756 A | 3/2004 |
| JP | 2004-153000 A | 5/2004 |
| JP | 2004-186265 A | 7/2004 |
| JP | 2006-049819 A | 2/2006 |

* cited by examiner

F I G. 6A
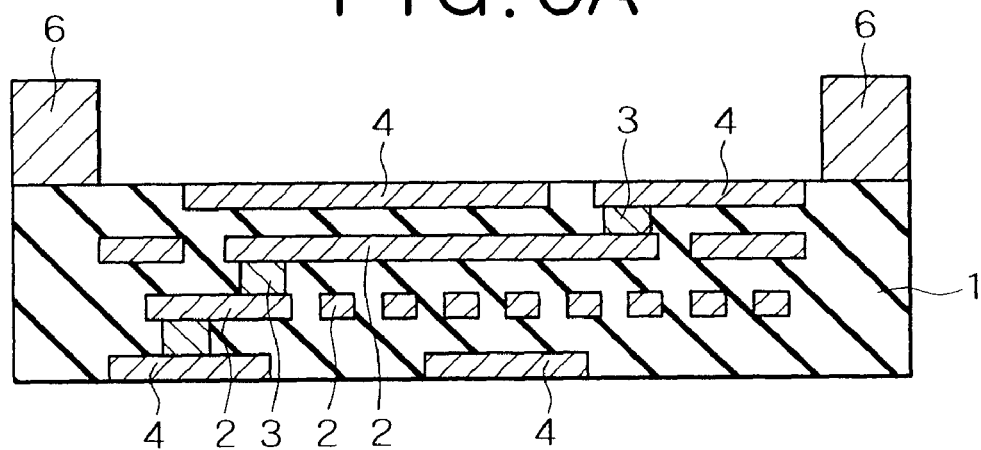
F I G. 6B
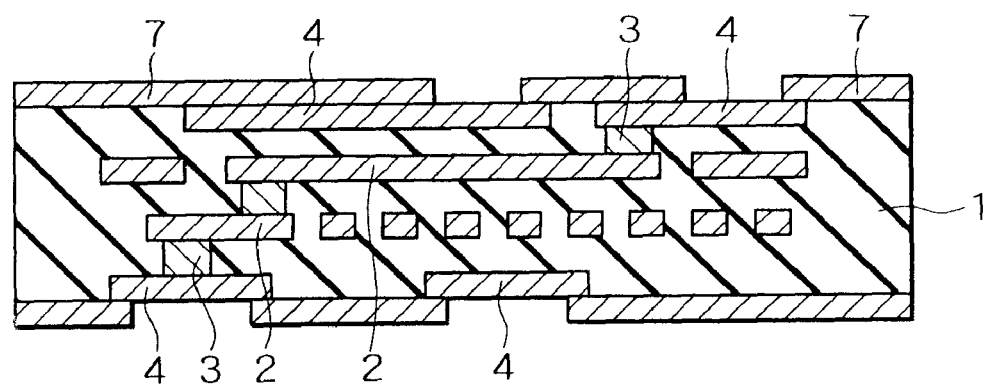
F I G. 6C
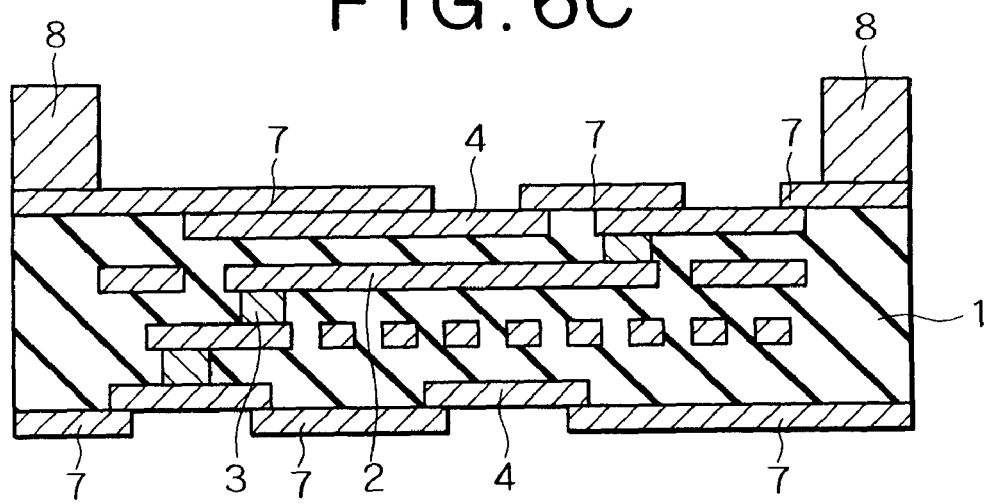

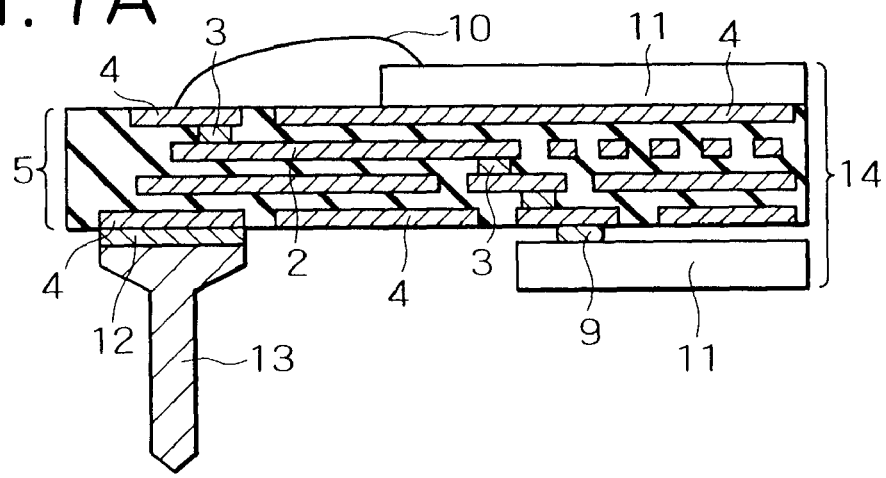
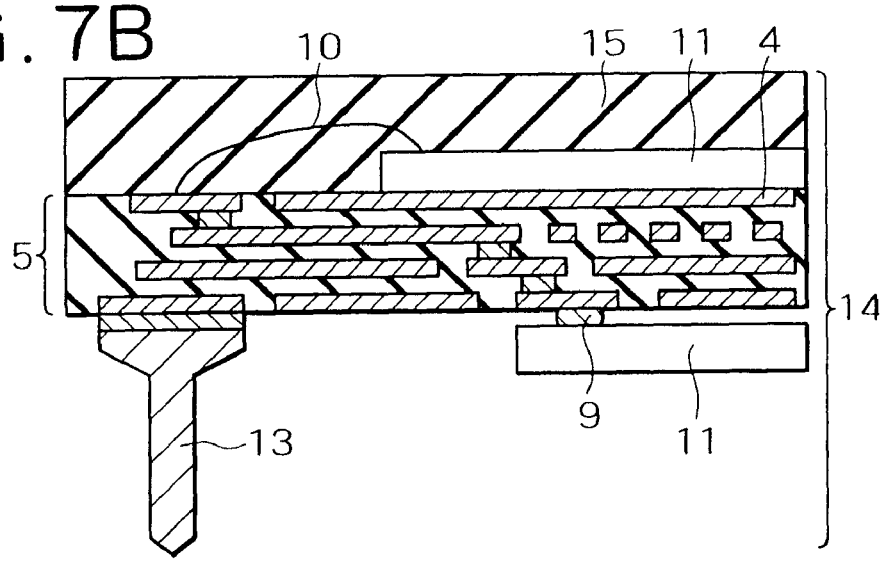
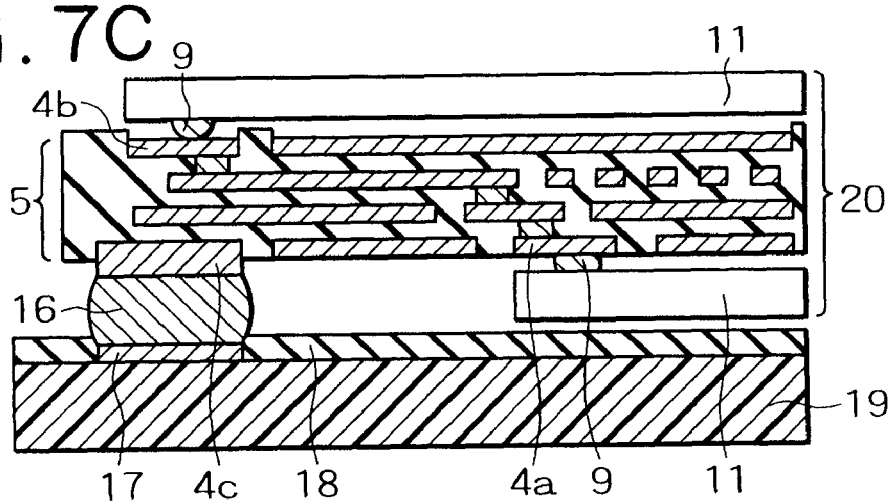

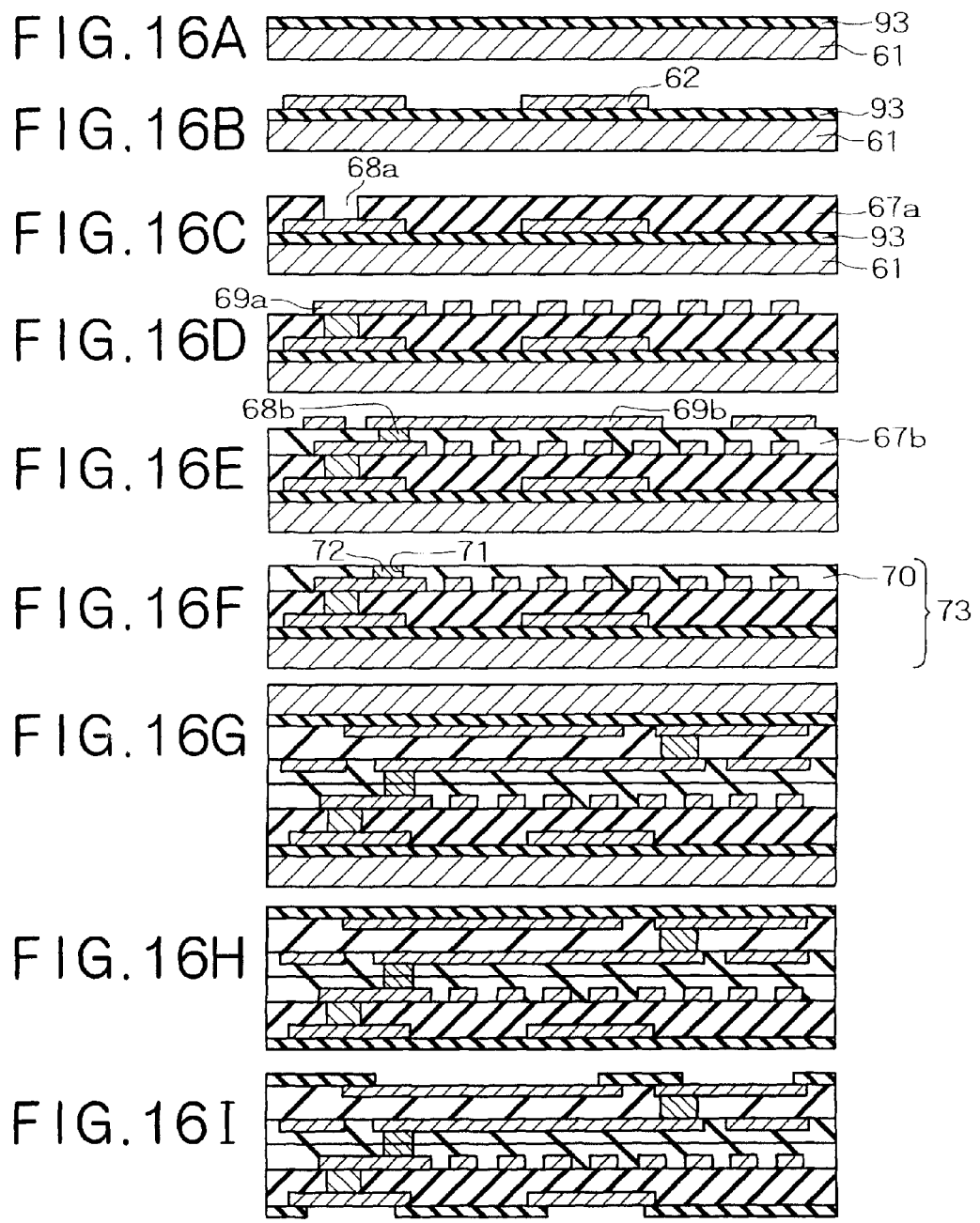

US 8,198,140 B2

WIRING SUBSTRATE FOR MOUNTING SEMICONDUCTORS, METHOD OF MANUFACTURING THE SAME, AND SEMICONDUCTOR PACKAGE

This application is a divisional application of U.S. application Ser. No. 11/174,526 filed Jul. 6, 2005, which claims priority from Japanese Patent Application No. 2004-200774 filed Jul. 7, 2004 and Japanese Patent Application No. 2005-138450 filed May 11, 2005, which applications are incorporated herein by reference.

BACKGROUND OF THE INVENTION

1. Field of the Invention

The present invention relates to a wiring substrate for mounting semiconductors, which is capable of mounting various types of devices at high density and high accuracy, particularly, further obtaining a package and a module having a high rate and excellent reliability, a method of manufacturing the same, and a semiconductor package using the wiring substrate.

2. Description of the Related Art

In recent years, in line with high integration, high speed and multi-functioning of semiconductor devices, the number of terminals has been increased, and the distance between pitches has been narrowed. In a wiring substrate for mounting semiconductors, which mounts these semiconductor devices, such a wiring substrate that is capable of mounting semiconductor devices at higher density and higher accuracy than ever before and is more excellent in reliability than ever before has been requested. As examples of a wiring substrate for mounting semiconductors that have been publicly known at present, there are listed a built-up substrate (For example, Japanese Published Unexamined Patent Application No. 2001-284783) in which high-density wiring layers are formed on a core printed circuit board by a successively-laminating method, and a collectively-laminated substrate (For example, Japanese Published Unexamined Patent Application No. 2003-347738) which is composed by collectively laminating resin sheets in which a wiring layer and vias are formed.

FIG. 1 is a sectional view showing a built-up substrate. As depicted in FIG. 1, a multi-layered wiring structure in an insulation layer in a base core substrate 103. Conductor wirings 102, one of which is formed on the upper surface of the base core substrate 103 and the other of which is formed on the lower surface thereof, are connected by a through-hole 101 passing through the insulation layer. On both the upper and lower surfaces of the base core substrate 103, inter-layer insulation films 105 are formed, and conductor wirings 106 are formed on the respective inter-layer insulation films 105. Further, a solder-resist layer 107 is formed on the inter-layer insulation film 105 so as to cover up a part of the conductor wiring 106. A via 104 is formed in the inter-layer insulation film 105 in order to electrically connect the conductor wirings 102 and the conductor wiring 106.

Additionally, if a further multi-layer is required, a multi-layered wiring structure can be formed by repeating a step for forming the inter-layer insulation film 105 and a step for forming the conductor wiring 106 one after another.

On the other hand, FIG. 2A through FIG. 2C are sectional views showing, in the order of step, one example of a method of manufacturing a collectively-laminated substrate. In the collectively-laminated substrate according to a conventional art, as depicted in FIG. 2A, a conductor wiring 112 is formed on a resin sheet 111, and a via 113 connected to the conductor wiring 112 is provided in the resin sheet 111. As depicted in FIG. 2B and FIG. 2C, a collectively laminated substrate 114 is formed, by providing a plurality of such resin sheets 111 and collectively laminating the same.

Still, in the built-up substrate and collectively laminated substrate according to the prior arts, such a structure is employed, in which a conductor wiring is formed on an insulation film, and electrode pads for mounting semiconductors are also formed on the insulation film. In recent years, in line with advancement of high density and minute wiring in the wiring substrates, the method for forming conductor wiring has been changed from a method (subtractive method) for etching a copper foil to a method (additive method) in which a resist layer is patterned with electrodes provided, and an electrolytically plated layer is precipitated and laminated.

However, there is a shortcoming in that electrode pads formed by the additive method are uneven in the height thereof, the shape of the upper surface of electrode pads is not flat but is made convex, wherein it becomes difficult to mount semiconductor devices having a large number of pins and narrow pitches. In addition, although there are generally many cases where a solder resist layer 107 is formed on the electrode pads, it becomes remarkably difficult to make the film thickness of the solder resist layer minute and the opening diameter highly accurate since the heights of the electrode pads have a large imbalance. Further, in line with making the electrode pads minute, the contacting area between the electrode pads and insulation films is lowered, a cohesion force between the electrode pads and insulation films is lowered, and in particular, there causes a problem, by which the electrode pads are stripped from the insulation films in the step of mounting semiconductor devices under high-temperature processing to which lead-free solder is applied.

In order to solve various problems described above, the present applicant proposed a method for forming a wiring structure and electrode pads to mount semiconductor devices thereon on a support body made of a metallic plate and having excellent flatness, and for mounting semiconductor devices on the electrode pads (Japanese Published Unexamined Patent Application No. 2002-83893).

However, in order to mount semiconductor devices at high density in line with remarkable advancement of high performance and multi-functioning in recent mobile apparatuses, the demand for mounting semiconductor devices on both of the front surface and the rear surface of a wiring substrate has been increased. Actually, however, although a conventional wiring substrate described in Japanese Published Unexamined Patent Application No. 2002-83893 described above is sufficient in a case where semiconductor devices are mounted on one surface, it is still difficult to mount semiconductor devices at high density in a case of mounting the same on both surfaces.

Further, for achievement of high reliability of a semiconductor package, it is highly recommended that a film having a lower thermal expansion ratio and a lower resiliency ratio is applied to a part of inter-layer insulation films that compose a wiring substrate for mounting semiconductors. However, with a conventional wiring substrate described above, there is a problem in that a lowering in structural reliability results from if insulation films having different physical properties are applied.

SUMMARY OF THE INVENTION

It is therefore an object of the present invention to provide a wiring substrate for mounting semiconductors, a method of manufacturing the same, and a semiconductor package, which is effective with an increase in the number of terminals in line with high integration, high speed and/or multi-functioning of semiconductor devices and for narrowing of pitches between terminals, is capable of mounting semiconductor devices at high density and high accuracy particularly on both surfaces of a substrate, and has excellent reliability.

A wiring substrate for mounting semiconductors according to the present invention includes: an insulation film; wires formed in the insulation film; a plurality of electrode pads whose surfaces are exposed to the front surface and the rear surface of the insulation film, and at least a part of the side surface thereof being buried in the insulation film; and a via by which the wires and the electrode pads are connected to each other.

Since the present invention is structured so that electrode pads on both of the front surface and rear surface of a wiring substrate are buried in an insulation film, it is possible to prevent the electrode pads on both of the front surface and rear surface from becoming uneven in height, and it becomes possible to mount semiconductor devices on both surfaces of a wiring substrate at high density and high accuracy. Further, since the side surface of the electrode pads are buried in the insulation film, cohesion of the electrode pads with the insulation film can be improved, wherein it is possible to obtain a wiring substrate for mounting semiconductors, which has excellent connection reliability with semiconductor devices.

The insulation film may includes: a first insulation layer located at the front surface of the wiring substrate; a second insulation layer located at the rear surface of the wiring substrate; and a singularity or a plurality of third insulation layers positioned in the interior of the wiring substrate. The third insulation layers may include: a plurality of wires buried in both of the front surface and the rear surface of the third insulation layers; and vias which connect the wire of the front surface and the wire of rear surface to each other. The electrode pads may be, respectively, exposed to the surface at the front surface side of the wiring substrate in the first insulation layer and to the surface at the rear surface side of the wiring substrate in the second insulation layer, and at least a part of the side surface thereof is buried in the first insulation layer or the second insulation layer.

In this case, since the structure has wires and vias buried in the front surface and rear surface of the third insulation layer positioned inside the wiring substrate, the first insulation layer is formed at the surface of the third insulation layer and the second insulation layer is formed at the rear surface thereof. Therefore, it is possible to prevent such a problem by which interface between the respective insulation films are stripped even if thermal load and biasing are repeatedly applied by operation of semiconductor devices, wherein it is possible to further improve the reliability of the wiring substrate for mounting semiconductors. To the contrary, since the conventional wiring substrate is structured so as to have wires on the front surface and rear surface of an internally positioned insulation film, there is a problem in that, when a stress for stripping the interface of insulation films is generated due to thermal load in line with operations of semiconductor devices, in particular in a case of a highly multi-layered structure, stripping of the interface between the insulation films is progressed.

In addition, the first insulation layer and the second insulation layer may be made of the same material or the first insulation layer and the second insulation layer may be made of different materials each other.

Further, the wiring substrate for mounting semiconductors according to the present invention may include a fourth insulation layer having wires and vias. The fourth insulation layer may be located at least one of between the first insulation layer and the third insulation layer and between the second insulation layer and the third insulation layer.

As described above, since in the present invention there is no case, by virtue of its structure, where the interface between the insulation layers is stripped, it is possible to combine insulation films having different physical properties. Therefore, there is an advantage by which a wiring substrate for mounting semiconductors, which is optimized for an application, can be formed. In particular, even if a fourth insulation layer having wires and vias is formed between the first insulation layer and the third insulation layer or between the second insulation layer and the third insulation layer, there is no case, by virtue of its structure, where the interface between the third insulation layer and the fourth insulation layer is stripped. Therefore, it is possible to secure reliability in practice.

As a concrete effect of combining different insulation layers, it is possible to prevent cracks from occurring on the surface of a wiring substrate due to a difference in thermal expansion ratio where a semiconductor device is mounted in a case where at least one of the first insulation layer and the second insulation layer is formed of a material whose film strength is higher than that of the third insulation layer and the fourth insulation layer. In addition, where at least one of the first insulation layer and the second insulation layer is made of a material whose thermal expansion ratio is lower than that of the third insulation layer and the fourth insulation layer, or where at least one of the first insulation layer and the second insulation layer is made of a material whose resiliency ratio is lower than that of the third insulation layer and the fourth insulation layer, it is possible to lower a stress to mounted semiconductor devices and a mother board in which the wiring substrate for mounting semiconductors according to the present invention is mounted, wherein it is possible to improve the reliability of the entire module unit.

Further, in order to prevent a crack from occurring on the surface of a wiring substrate due to a difference in the thermal expansion ratio when mounting a semiconductor device, the first insulation layer may employ a material whose film strength is higher than that of the third insulation layer and the fourth insulation layer, and in order to lower a stress onto a mother board, the second insulation layer may employ a material whose resiliency ratio is lower than that of the third insulation layer and the fourth insulation layer, wherein the first insulation layer and the second insulation layer are made of different materials, and it becomes possible to easily combine insulation layers whose reliability is maximized to applications.

Also, the exposed surface of at least one of the electrode pads may be located at the same level as the front surface or the rear surface of the insulation film, or located at a position recessed from the front surface or the rear surface of the insulation film, or located at a position protruding from the front surface or the rear surface of the insulation film.

If the exposed surface of the electrode pad is located at the same level as the front surface or the rear surface of the insulation layer, where a semiconductor device is electrically connected via a gold bump, it becomes possible to obtain a semiconductor package structure that achieves highly accurate connections at a greater minute pitch. In addition, where the exposed surface of the electrode pads are located at a recessed position from the front surface or the rear surface of an insulation film, it is possible to obtain a semiconductor package structure that achieves highly accurate connections at a greater minute pitch where a semiconductor device is mounted by wire bonding or using solder. Further, where the exposed surface of the electrode pads are located at a position protruding from the front surface or the rear surface of an insulation film, it is possible to prevent breakage cracks of soldering balls from occurring when a solder ball is mounted and a mother board is mounted therein, and a semiconductor package whose reliability is further excellent can be brought about.

Still further, the wiring substrate for mounting semiconductors according to the present invention may have a support body disposed at least one of the front surface and the rear surface of the insulation film. In addition, the wiring substrate for mounting semiconductors according to the present invention may have a solder resist layer disposed at least one of the front surface and the rear surface of the insulation film.

Further, a wiring substrate for mounting semiconductors according to the present invention may be constructed so that a part of the surface of at least one of the electrode pads is covered with the insulation film.

Where a part of the surface of an electrode pad buried in the insulation film is covered with the insulation film, since such a structure is adopted in which the greater part of the pad is buried in resin, a crack resulting from the pad end hardly occurs, wherein the reliability is made excellent. Also, since the opened insulation film functions as a solder resist layer, the adhesivity to a metal that forms a pad or wires is further excellent in comparison with a method for forming a solder resist layer after etching a support body. Therefore, a stable solder resist layer can be formed, and concurrently, an opening can be formed on the pad after confirming the pad position, wherein it is possible to form an opening on the pad at high accuracy.

Also, a support body may be provided at least on a part of one of the front surface or the rear surface of the insulation film. Further, a solder resist layer may be provided at least on one of the front surface or the rear surface of the insulation film.

In the present invention, for example, the insulation film may be formed by forming electrode pads of the front surface side of the insulation film, a first insulation layer, and wires and vias in the interior of the first insulation layer on a first support substrate, forming electrode pads of the rear surface side of the insulation film, a second insulation layer, and wires and vias in the interior of the second insulation layer on the second support substrate, making the first insulation layer and the second insulation layer integral with each other by adhering the same to each other, and removing the entirety or a part of the first support substrate and the second support substrate. In this case, the support substrates may be made of a metallic plate.

In this case, since the electrode pads are formed on the first support substrate and the second support substrate, which is high in the positional accuracy of the exposed surfaces of the electrode pads, it becomes easy to secure high density.

In the present invention, the relationship between the front surface side size of the via formed in the first insulation layer and the rear surface side size thereof and the relationship between the front surface side size of the via formed in the second insulation layer and the rear surface side size thereof may be reversed. For, example, the front surface side size of the via formed in the first insulation layer may be smaller than the rear surface side size thereof and the rear surface side size of the via formed in the second insulation layer may be smaller than the front surface side size thereof.

By making the front surface side size and rear surface side size of a via different from each other, a difference can be brought about in the wiring density on both of the front surface and the rear surface of the via, and the size at the side where a high wiring density is required can be made small. Since such a tendency exists in which the diameter of a via at the side into which a laser beam or light is made incident is generally liable to become greater in a laser via which is formed by a laser beam and a photo via which is formed by light, the incident direction of a laser beam or light to form a laser via or a photo via in the first insulation layer is made opposite the incident direction of a laser beam or light to form a laser via or a photo via in the second insulation layer, whereby it is possible to control the front surface side size and the rear surface side size so that these sizes are reversed.

Still further, since, in a high performance semiconductor device, an interval between pads being a connection point with a wiring substrate is remarkably narrow, and is predicted to become increasingly narrower from now on, it is highly recommended that the via size at the front surface side and the rear surface side where semiconductor devices are mounted is small. Since it is possible to mount a semiconductor device on both sides in a wiring substrate for mounting a semiconductor according to the present invention, in this case, it is preferable that the front surface side size of a via formed in the first insulation layer is smaller than the rear surface side size thereof, and the rear surface side size of a via formed in the second insulation layer is smaller than the front surface side size thereof.

A semiconductor package according to the present invention includes: the wiring substrate for mounting semiconductors; and a semiconductor device mounted on the wiring substrate for mounting semiconductors. An exposed surface of the electrode pad provided at a point where the semiconductor device is mounted, of the plurality of electrode pads of the wiring substrate for mounting semiconductors, is located at the same level as the front surface or the rear surface of the insulation film or at a position recessed from the front surface or the rear surface thereof.

Another semiconductor package is mounted on a mother board. The semiconductor package includes: a wiring substrate for mounting semiconductors; and a semiconductor device mounted on the wiring substrate for mounting semiconductors. An exposed surface of the electrode pad provided at a point where the semiconductor device is mounted, of the plurality of electrode pads of the wiring substrate for mounting semiconductors, is located at the same level as the front surface or the rear surface of the insulation film or at a position recessed from the front surface or the rear surface thereof. And, an exposed surface of the electrode pads provided at a point where a bump for connecting to the mother board is mounted is located at a position protruding from the front surface or the rear surface of the insulation film.

A first method of manufacturing a wiring substrate for mounting semiconductors includes: forming two wiring substrates with a support substrate; adhering the intermediate layers, which are made into the uppermost surface of the two wiring substrates with a support substrate, to each other in a face-to-face state; and removing a part or the entirety of the support substrates. The forming each of the wiring substrates with a support substrate includes: forming a conductive layer which becomes electrode pads on the support substrate; forming an insulation layer on the conductive layer; forming one or more intermediate layers on the insulation layer, forming via holes in the intermediate layer that is made into an uppermost surface of the one or more intermediate layer; and filling a conductor in via holes to form vias. The forming each of intermediate layers includes: forming vias in the insulation layer; forming a wiring on the insulation layer; and forming other insulation layer on the wiring.

Also, the conductor may be conductive paste or solder.

In the present invention, since the wiring substrate for mounting semiconductors is formed by adhering the two wiring substrates formed on the support substrate face to face, the positional accuracy for adhering the substrates together is further satisfactory than in a case of a conventional collectively laminated substrate in which a plurality of resin sheets are collectively laminated, and it is possible to form a wiring substrate for mounting semiconductors, which is high in density and excellent in reliability. Also, there is an advantage in that multi-layers can be formed in a short time, in comparison with a conventional built-up substrate.

The first method may further comprises forming an underlayered insulation layer on the support substrate before the forming the conductive layer.

With the method, since the underlayered insulation layer is first formed on the support substrate, and a metal layer such as a pad is formed, the underlayered insulation layer on the support substrate functions as an intensive etching barrier layer. Therefore, a possibility for the pad and wiring to be damaged by an etching solution when etching a copper plate is made slight, wherein a package substrate having high reliability can be obtained. Also, since the opened underlayered insulation layer functions as a solder resist layer, adhesivity to a metal to form a pad and wires is excellent in comparison with a method for forming a solder resist layer after etching the support substrate. Therefore, a stable solder resist layer can be formed, and simultaneously, an opening can be formed on the pad after confirming the pad position, wherein it is possible to form the opening on the pad at high accuracy.

Conventionally, if the wiring substrates are laminated under a remarkably high temperature and high pressure where two wiring substrates formed on the support substrates are adhered face to face, there is a problem in that the wiring substrates formed in advance on the support substrates have distortions and the reliability thereof is lowered. To improve this, in the present invention, electric connections are obtained by making the uppermost surface insulation layer flat, forming via holes in the insulation layer, filling a conductor such as conductive paste and solder therein to form vias, and laminating the vias each other. Since flat surfaces are adhered to each other, it is possible to adhere two wiring substrates formed on the support substrates face to face even under conditions of low temperature and low pressure, and it is possible to obtain a wiring substrate for mounting semiconductors, which has high accuracy and excellent reliability.

A second method of manufacturing a wiring substrate for mounting semiconductors according to the present invention includes: forming two wiring substrates with a support substrate; adhering the intermediate layers, which are made into the uppermost surface of the two wiring substrates with a support substrate, to each other in a face-to-face state; and removing a part or the entirety of the support substrates. The forming each of the wiring substrates with a support substrate includes: forming a conductive layer which becomes electrode pads on the support substrate; forming an insulation layer on the conductive layer; forming one or more intermediate layers on the insulation layer, forming via holes in the intermediate layer that is made into an uppermost surface of the one or more intermediate layer; filling a conductor in via holes to form vias; and forming a wiring on the insulation layer that is made into an uppermost surface. The forming each of intermediate layers includes: forming vias in the insulation layer; forming a wiring on the insulation layer; and forming other insulation layer on the wiring.

In the second method, there is an advantage in that the number of processes can be reduced because the step of filling a conductor into via holes formed in the insulation layer is required only in either one of the support substrates, although the accuracy may be lowered more or less in comparison with the first method described above. However, since two wiring substrates formed on the support substrates are adhered to each other face to face under an appropriately low temperature and low pressure, the characteristics of the insulation layer in burying the conductor are important. That is, it is preferable that an insulation layer, which can be formed at a low hardening temperature and low laminating pressure, is employed with respect to the other insulation layers. Therefore, it is possible to form a wiring substrate for mounting semiconductors, which is excellent in reliability, at low cost.

The second method may further comprises forming an underlayered insulation layer on the support substrate before the forming the conductive layer.

In the present invention, since a step for forming a via in the insulation layer and filling a conductor therein is required for only a wiring substrate formed on only either of the support substrates, there is an advantage by which the steps can be shortened, and the nderlayered insulation layer on the support substrate functions as an intensive etching barrier, wherein a package substrate having high reliability can be brought about, and adhesivity to a metal to form pads and wires is excellent. Therefore, it is possible to form the opening with the pads maintained at high accuracy.

In addition, where the underlayered insulation layer is formed on a support substrate, the method may further comprises forming an opening in the part of the underlayered insulation layer located on at least one or more parts of the conductive layer which become electrode pads after the removing a part or the entirety of the support substrate. Although various methods for forming such an opening are available, it is preferable that the opening is formed by laser or dry etching particularly in view of positional accuracy and easiness of formation.

The support substrate employed in the method of manufacturing a wiring substrate for mounting a semiconductor according to the present invention may be featured in a support substrate which is composed of a thin film metal layer and a thicker support metal layer than the thin film metal layer as components.

Where the support substrate is composed of a thin film metal layer and a thicker support metal layer than the thin film metal layer, it is possible to remove only the thicker support metal layer with only the thin film metal layer remaining on the substrate side, wherein it is possible to make remarkably thin the metal layer, which thereafter is necessary to be removed by etching, etc.

Further, in the method for forming an insulation layer on the support substrate and forming an opening in the insulation layer by laser, the opening is formed by laser with a thin film metal layer remaining. Thereafter, a de-smearing process may be carried out. In the method, since portions other than the via openings are covered by the thin film metal layer, no resin damage occurs due to a de-smearing liquid in the de-smearing process, and a problem of contamination in the de-smearing liquid can be relieved.

BRIEF DESCRIPTION OF THE DRAWINGS

FIG. 6A through FIG. 6C are, respectively, sectional views depicting a wiring substrate for mounting semiconductors according to a first embodiment of the present invention;

FIG. 7A through FIG. 7C are sectional views depicting respectively a semiconductor package according to each embodiment of the present invention;

FIG. 16A through FIG. 16I are sectional views depicting a method of manufacturing a wiring substrate for mounting a semiconductor according to the sixth embodiment of the present invention in the order of the steps thereof;

DETAILED DESCRIPTION OF THE PREFERRED EMBODIMENTS

Figure 1:
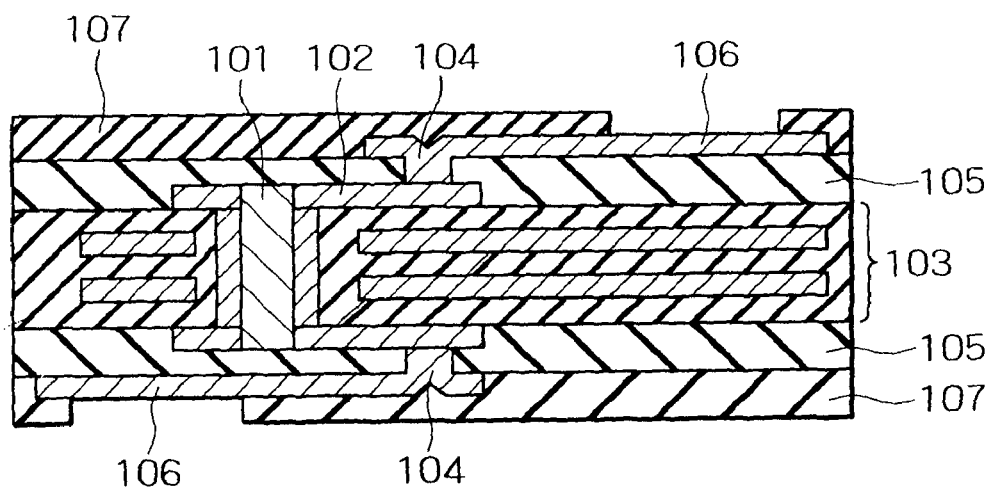
FIG. 1 is a sectional view showing a conventional built-up substrate.
Figure 2A:
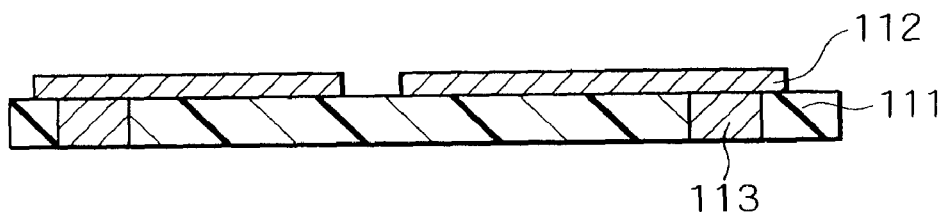
FIG. 2A through FIG. 2C are sectional views depicting a method of manufacturing a conventional collectively laminated substrate in the order of steps.
Figure 2B:
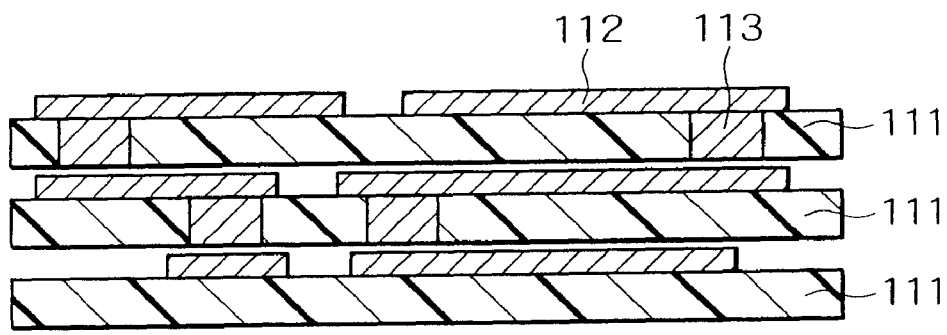
Figure 2C:
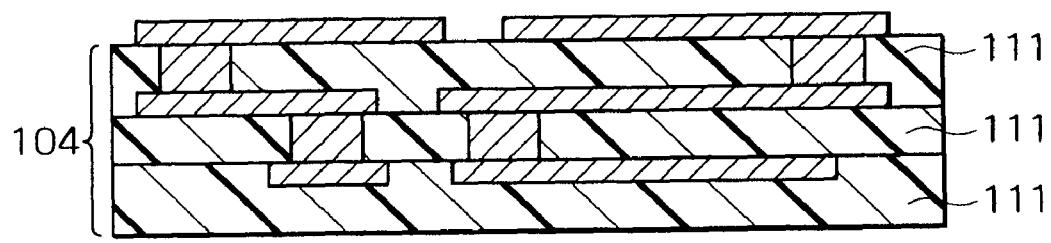
Figure 3:
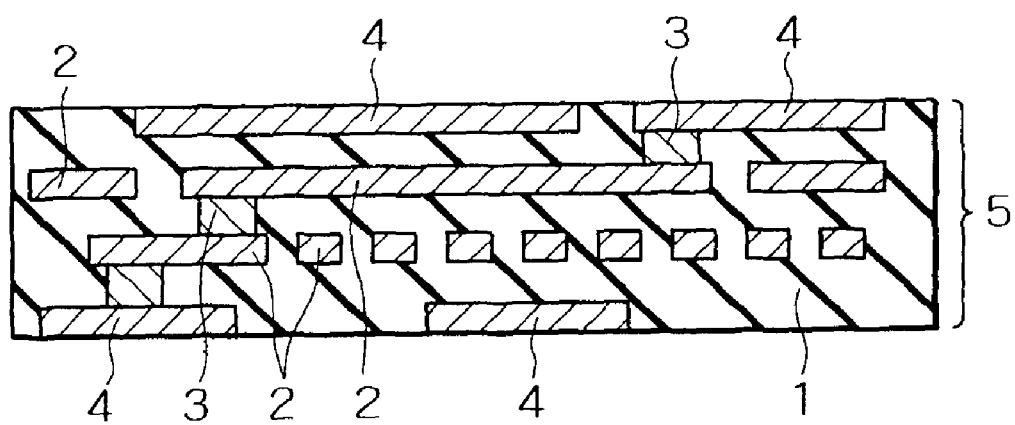
FIG. 3 is a sectional view depicting a wiring substrate for mounting semiconductors according to a first embodiment of the present invention.

Hereinafter, a detailed description is given of embodiments of the present invention with reference to the accompanying drawings. First, a description is given of a first embodiment of the present invention with reference to FIG. 3. FIG. 3 is a sectional view depicting a wiring substrate for mounting semiconductors according to the first embodiment. In a wiring substrate 5 for mounting semiconductors according to the first embodiment, wires 2 and vias 3 which electrically connect upper and lower wires 2 to each other, are provided in the insulation film 1. Electrode pads 4 are provided on both of the front surface and the rear surface of the substrate 5, that is, on both of the front surface and the rear surface of the insulation film 1. At least a part of the side of the electrode pad 4 is buried in the insulation film 1.

The insulation film 1 is composed by laminating a plurality of insulation layers, and the wire 2 is provided by forming patterns of conductive film on the respective insulation layers. When forming the wire 2, a via hole reaching the lower-layer wire 2 is formed in the insulation layer, and a wiring conductive material is buried in the via hole, thereby forming a via 3.

Materials of the respective insulation layers that compose the insulation film 1 are identical to each other. There is no special limitation with respect to the materials of insulation films 1 as long as the materials are excellent in heat resistance for soldering and chemical resistance. However, it is preferable that heat-resisting resins such as epoxy resin, polyimide, liquid crystal polymer, etc., which are high in glass-transition temperature and excellent in mechanical characteristics such as film strength, breakage elongation ratio, etc are applied. Also, where the insulation film 1 is made thin to become 0.3 mm or less, in order to improve handling convenience when mounting semiconductor devices, it is preferable that a material having a high bending resiliency ratio, which is impregnated glass cloth or aramid unwoven cloth, etc. with resin, is applied as a material for the insulation film 1.

Since a wiring substrate 5 for mounting semiconductors is structured so that the electrode pads 4 on both of the front surface and the rear surface of the substrate 5 are buried in the insulation film 1, it is possible to prevent unevenness in height of the electrode pads 4 on both the front surface and the rear surface of the substrate 5, and it is possible to mount semiconductor devices on both sides of the wiring substrate 5 for mounting semiconductors at high density and high accuracy. Further, since the sides of the electrode pads 4 are buried in the insulation film 1 composed of the same material, it is possible to obtain a wiring substrate 5 for mounting semiconductors, in which cohesion between the electrode pads 4 and the insulation film 1 is improved, and having excellent reliability in connection with semiconductor devices.

Figure 4A:
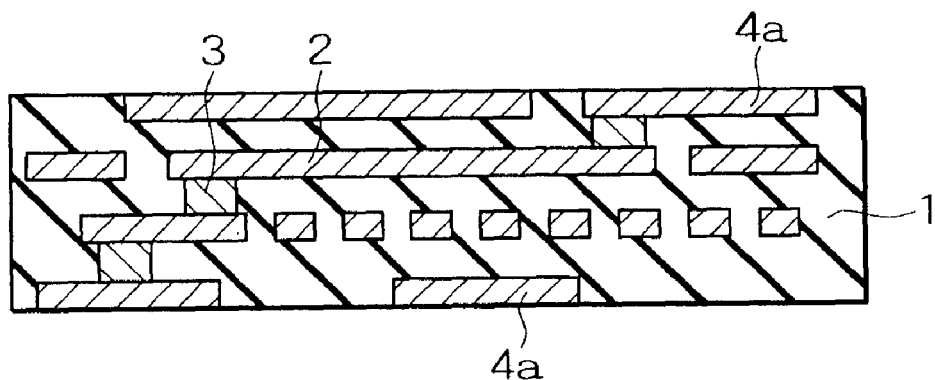
FIG. 4A through FIG. 4C are sectional views depicting respectively a wiring substrate for mounting semiconductors according to a variation of the first embodiment.
Figure 4B:
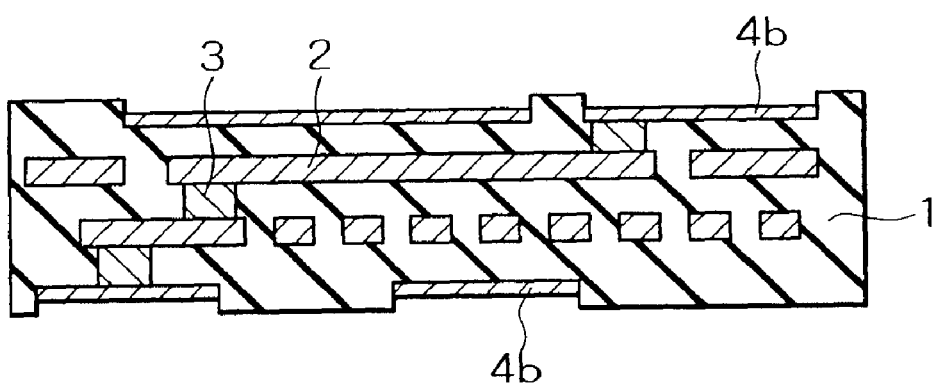
Figure 4C:
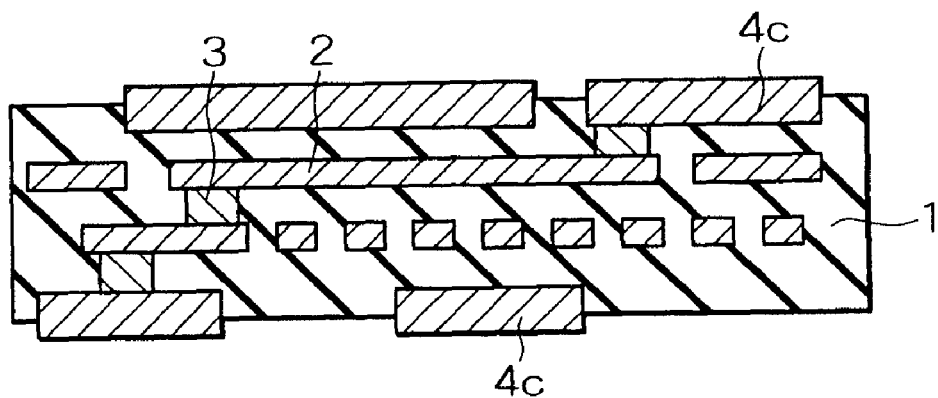

FIG. 4A through FIG. 4C are sectional views depicting a wiring substrate for mounting semiconductors according to a variation of the first embodiment. That is, electrode pads 4 formed on both the front surface and the rear surface of the insulation film 1 may be made into either one of an electrode pad 4a having its exposed face located at the same position of the front surface or the rear surface of the insulation film 1 as depicted in FIG. 4A, an electrode pad 4b having its exposed face located at a position recessed from the front surface or the rear surface of the insulation film 1 as depicted in FIG. 4B, and an electrode pad 4c having its exposed face located at a position protruding from the front surface or the rear surface of the insulation film 1 as depicted in FIG. 4C.

As depicted in FIG. 4A, about the electrode pads 4a having their exposed faces located at the same level as the front surface or the rear surface of the insulation film 1, in a case of mounting a semiconductor device thereon by using a gold bump, since there is no unevenness in height of the electrode pads 4a, it is possible to achieve connections of semiconductor devices at the highest accuracy and minute pitches. In addition, as depicted in FIG. 4B, about the electrode pads 4b having their exposed faces located at the front surface or the rear surface of the insulation film 1, in a case of mounting semiconductor devices thereon by using gold wire bonding or soldering, since the insulation film 1 located at a convex position from the electrode pads 4b can prevent gold bump or soldering from being excessively deformed, it is possible to achieve connections of semiconductor devices at the highest accuracy and minute pitches. Further, as depicted in FIG. 4C, about the electrode pads 4c having their exposed faces located at a position protruding from the front surface or the rear surface of the insulation film 1, when a soldering ball is mounted thereon and a mother board is further mounted, it is possible to prevent cracks from the base of the soldering ball from occurring, and it becomes possible to obtain a semiconductor package which is further excellent in reliability.

Figure 5A:
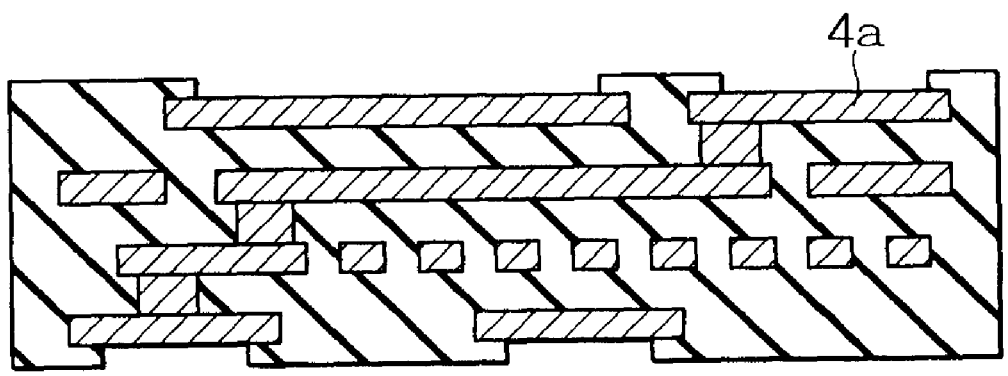
FIG. 5A and FIG. 5B are sectional views depicting a wiring substrate for mounting a semiconductor according to another variation of the first embodiment.
Figure 5B:
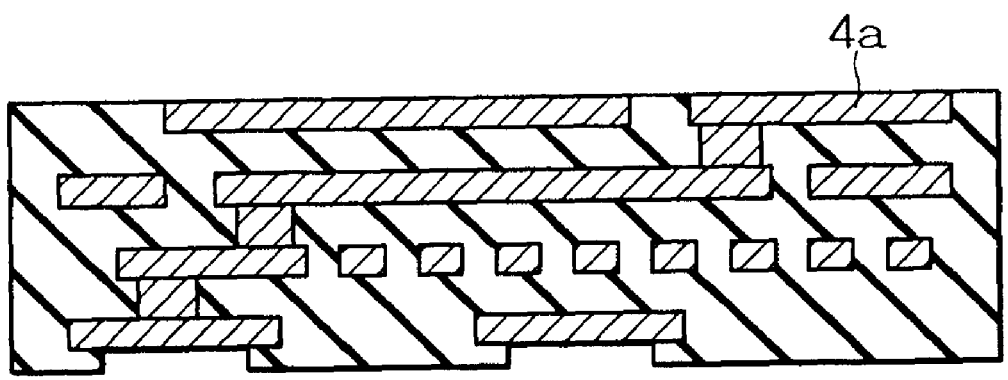

FIG. 5A and FIG. 5B are sectional views depicting a wiring substrate for mounting semiconductors according to a variation of the present embodiment. That is, the electrode pads formed on both the front surface and the rear surface of an insulation film have a part of the surface thereof covered by the insulation film as depicted in FIG. 5A. On the other hand, in FIG. 5B, a part of the exposed surface of the electrode pad located on the rear surface (the under side in the drawing) is covered by the insulation film, and the electrode pad located on the front surface (the upper side in the drawing) is located on the same level as the surface of the insulation film. In FIG. 5A and FIG. 5B, the electrode pads formed on the front surface or the rear surface of the insulation film, a part of the surface of which is covered by the insulation film, are located at a recessed position from the front surface or the rear surface of the insulation film 1. However, the position thereof is not limited thereto.

FIG. 6A through FIG. 6C are sectional views depicting a wiring substrate for mounting semiconductors according to another variation of the first embodiment. That is, a wiring substrate depicted in FIG. 6A is such that a support body 6 is provided with at least one of the front surface and the rear surface of the insulation film 1. By providing the support body 6, it is possible to prevent the wiring substrate 5 for mounting semiconductors from warping or undulating due to thermal history for mounting semiconductor devices, wherein it is possible to mount semiconductor devices at higher accuracy.

In addition, as depicted in FIG. 6B, a soldering resist layer 7 may be formed for at least one of the front surface and the rear surface of the insulation film 1. In particular, in a wiring substrate 5 for mounting semiconductors according to the present embodiment, since the unevenness in height of electrode pads 4 is remarkably slight, it is possible to form a soldering resist layer 7 at high accuracy. Further, as depicted in FIG. 6C, a support body 8 may be provided with at least a part of the surface of the soldering resist layer 7.

Next, a description is given of a semiconductor package according to the present embodiment. FIG. 7A through FIG. 7C are sectional views depicting a semiconductor package according to the present embodiment. A semiconductor package 14 according to the present embodiment is, as depicted in FIG. 7A such that a semiconductor device 11 is mounted on a wiring substrate 5 for mounting semiconductors by providing a bump 9 on the wiring substrate 5 for mounting semiconductors, connecting the electrode pads 4 to the semiconductor device 11, overlapping and connecting terminals on one side of another semiconductor device 11 and the electrode pads 4 to each other, and electrically connecting terminals of the other side of the another semiconductor device 11 and the electrode pads 4 via a bonding wire 10. Further, a external terminal pin 13 is connected to the package 14 via a conductive adhesive agent 12, etc.

The electrode pad 4 provided at a point where the semiconductor device 11 is mounted is made into an electrode pad 4a having the exposed face of the electrode pad 4 in FIG. 4A located at the same level as the front surface or the rear surface of the insulation film 1, or an electrode pad 4b having the exposed face in FIG. 4B located at a position recessed from the front surface or the rear surface of the insulation film 1, wherein it is possible to achieve a semiconductor package 14 having high accuracy and high density. In addition, in the present embodiment, an example of mounting a semiconductor device 11 is depicted, to which a flip chip connection using a bump 9 and a wire-bonding connection using a wire 10 are applied. However, it is possible to mount a semiconductor device 11 by using a tape automated bonding method or a ribbon bonding method, etc., in addition thereto.

Also, as necessary, as depicted in FIG. 7B, a molding 15 may be formed.

Further, a semiconductor package 20 depicted in FIG. 7C is mounted on a mother board 19. The mother board 19 has an electrode pad 17 and a soldering resist layer 18 provided on the surface thereof, and, as depicted in FIG. 4C, the electrode pad 4c having the exposed face located at a position protruding from the rear surface of the insulation film 1 is provided on the rear surface of the semiconductor package 20. By connecting the electrode pad 17 of the mother board 19 to the electrode pad 4c via a soldering ball 16, the package 20 is mounted on the mother board 19. In addition, as depicted in FIG. 4B, an electrode pad 4b having the exposed face located at a position recessed from the front surface of the insulation film 1 is provided on the front surface of the semiconductor package 20, wherein a semiconductor device 11 is mounted on the electrode pad 4b via a bump 9. Also, as depicted in FIG. 4A, an electrode pad 4a having the exposed face located at the same position as the rear surface of the insulation film 1 is provided on the rear surface of the package 20, and a semiconductor device 11 is mounted on the electrode pad 4a via a bump 9. Still, it is preferable that the electrode pad 4 to which the semiconductor device 11 is connected via a bump 9 is made into an electrode pad 4a or 4b, and the electrode pad 4 secured at a point where a soldering ball 16 is mounted is made into an electrode pad 4a or 4c, whereby the semiconductor device 11 can be mounted at high accuracy and high density, and it is possible to prevent cracks from the base of the soldering ball 16 from occurring. Therefore, a semiconductor package 14 having further excellent reliability can be brought about.

Figure 8A:
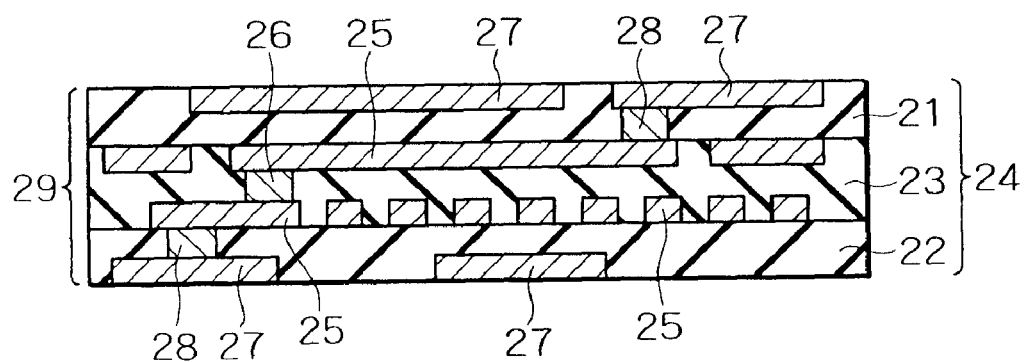
FIG. 8A and FIG. 8B are, respectively, sectional views depicting a wiring substrate for mounting semiconductors according to a second embodiment of the present invention.
Figure 8B:
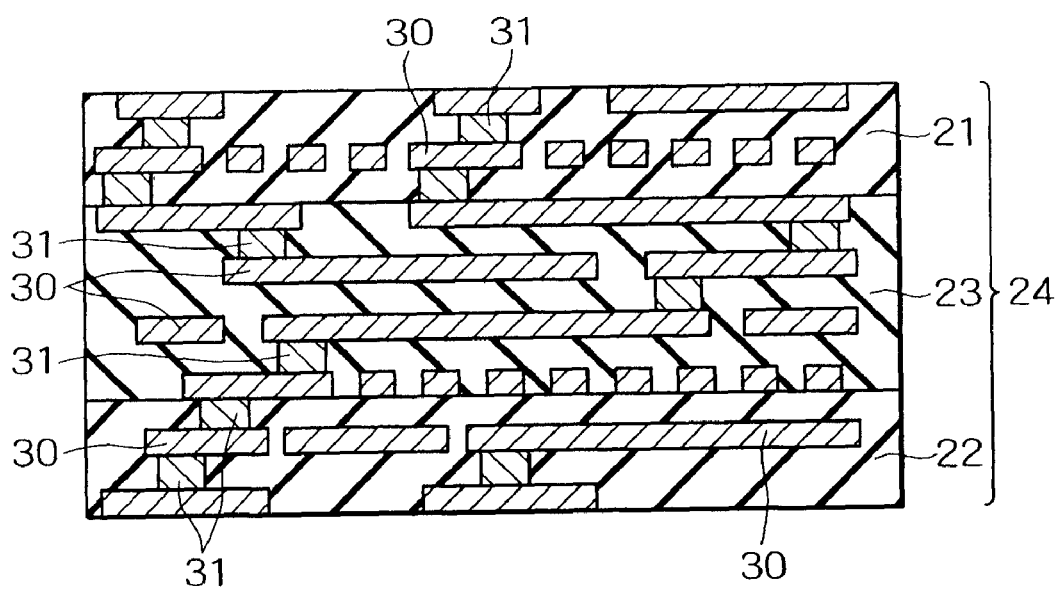

Next, a description is given of a wiring substrate for mounting semiconductors according to a second embodiment of the present invention. FIG. 8A and FIG. 8B are sectional views depicting a wiring substrate for mounting semiconductors according to the second embodiment. As depicted in FIG. 8A, a wiring substrate 29 for mounting semiconductors according to the present embodiment is provided with an insulation film 24 having at least the first insulation layer 21 located on the front surface thereof, the second insulation layer 22 located on the rear surface thereof, and the third insulation layer 23 located in the interior portion, wherein the third insulation layer 23 is provided with wires 25 buried in the front surface and the rear surface thereof and further vias 26 by which the wires 25 are electrically connected, and is provided with electrode pads 27 secured with the surface thereof exposed, and with at least a part of the sides buried in the insulation film 24, and the electrode pad 27 and the wires 25 are electrically connected to each other by a via 28. As described above, the electrode pad 27 may be made into either type of an electrode pad having the exposed face buried in the insulation film 24 located at the same level as the front surface or the rear surface of the insulation film 24 as depicted in FIG. 4A, an electrode pad having the exposed face thereof located at a position recessed from the front surface or the rear surface of the insulation film 24 as depicted in FIG. 4B, or an electrode pad having the exposed face located at a position protruded from the front surface and the rear surface of the insulation film 24, as depicted FIG. 4C.

In a conventional wiring substrate, where a wiring substrate is formed by laminating insulation layers composed of a material differing from that of an internally positioned insulation layer since the conventional wiring substrate has such a structure that wires are provided on the front surface and the rear surface of an internally positioned insulation layer, a stress is generated, which peels off the interface between insulation layers due to a difference in thermal expansion ratio due to thermal load in line with operations of a semiconductor device, and there is a fear that the interface between the insulation layers are stripped, starting from wiring ends whose structural cohesion is weak.

To the contrary, the wiring substrate 29 for mounting semiconductors according to the present embodiment is structured so as to have wires 25 buried in the front surface and the rear surface of the third insulation layer which is internally positioned. Therefore, even if the insulation film 24 is composed by forming the first insulation layer 21 and the second insulation layer 22 of a material differing from that of the third insulation layer 23, the entire surface of the third insulation layer 23 receives a stripping stress generated by repeated applications of thermal load and biasing due to operations of semiconductor devices, wherein it is possible to completely prevent the interface from being stripped, starting from wiring ends.

Accordingly, in the wiring substrate 29 for mounting semiconductors according to the present embodiment, materials made of optical physical properties suitable for purposes may be chosen for the first insulation layer 21 positioned on the front surface thereof, the second insulation layer 22 positioned on the rear surface thereof, and the third insulation layer 23 positioned in the interior portion thereof.

In addition, as depicted in FIG. 8B, the wiring substrate 29 for mounting semiconductors according to the present embodiment can be made into a further multi-layered wiring substrate by providing wires 30 and vias 31 in the interior of the first insulation layer 21 positioned on the front surface thereof, the second insulation layer positioned on the rear surface thereof, and the third insulation layer 23 positioned in the interior portion thereof.

Furthermore, it is also possible to form semiconductor packages 14 and 20, as in the wiring substrate 5 for mounting semiconductors, by using the wiring substrate 29 for mounting semiconductors according to the present embodiment. Where a semiconductor device is mounted on both sides of the wiring substrate 29 for mounting semiconductors, a rigid material having a high resiliency ratio is chosen for the third insulation layer 23 in order to improve its handling convenience, and the material having a higher film strength or having a lower thermal expansion ratio than the third insulation layer 23 is applied to the first insulation layer 21 and the second insulation layer 22, whereby such an effect can be brought about, which can prevent cracks generated on the surface of the wiring substrate 29 for mounting semiconductors due to a difference in the thermal expansion ratio when a semiconductor device is mounted. In addition, where the wiring substrate 29 for mounting semiconductors is mounted on a mother board with semiconductor devices mounted at the first insulation layer 21 side of the wiring substrate 29 for mounting semiconductors and with not only the semiconductor devices but also soldering balls mounted at the second insulation layer 22 side thereof, a rigid material having a high resiliency ratio is chosen for the third insulation layer 23 in order to improve handling convenience, a material having a higher film strength or a lower thermal expansion ratio than the third insulation layer 23 is applied for the first insulation layer 21, and a material having a lower resiliency ratio than the third insulation layer 23 is applied for the second insulation layer 22. That is, it is possible to form a wiring substrate 29 for mounting semiconductors whose reliability is optimized, by employing materials differing from each other for all the insulation layers.

Figure 9:
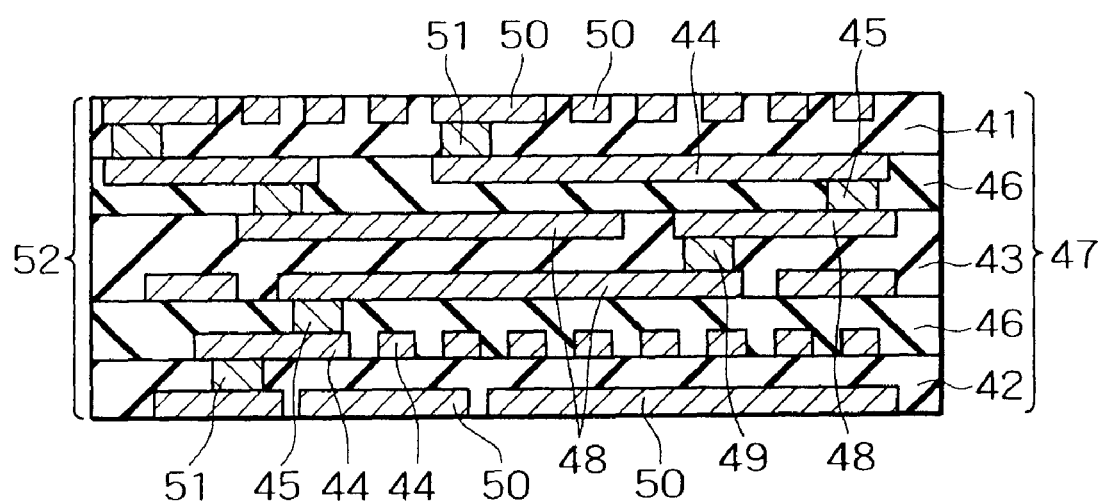
FIG. 9 is a sectional view depicting a wiring substrate for mounting semiconductors according to a third embodiment of the present invention.

Next, a description is given of a third embodiment of the present invention. FIG. 9 is a sectional view depicting a wiring substrate for mounting semiconductors according to the third embodiment. A wiring substrate 52 for mounting semiconductors according to the present embodiment is provided with an insulation film 47 including the first insulation layer 41 positioned on the front surface thereof, the second insulation layer 42 positioned on the rear surface thereof, the third insulation layer 43 positioned in the interior portion thereof, and the fourth insulation layer 46 provided at least one of between the first insulation layer 41 and the third insulation layer 43 and between the second insulation layer 42 and the third insulation layer 43. And, wires 44 and vias 45 are formed in the fourth insulation layer 46. Wires 48 buried in the front surface and the rear surface of the third insulation layer 43 and vias 49 to electrically connect the wires 48 are formed in the third insulation layer 43. Electrode pads 50 whose surface is exposed and at least a part of the sides of which is buried in the insulation film 47 are formed on the front surface and the rear surface of the insulation film 47, wherein the electrode pads 50 and wires 44 are electrically connected to each other through vias 51.

The wiring substrate 52 for mounting semiconductors according to the present embodiment is structured so that it includes wires 48 buried in the front surface and the rear surface of the third insulation layer 43 which is positioned in the interior thereof, and the wires 44 are buried in the fourth insulation layer 46. Therefore, since the entire surfaces of the third insulation layer 43 and the fourth insulation layer 46 receive a stripping stress generated by repeated applications of thermal load and biasing due to operations of semiconductor devices even if the insulation film 47 is formed by employing materials differing from each other in all the insulation layers, it is possible to completely prevent the interface of the insulation layers from being stripped, starting from the wiring ends.

Also, with the wiring substrate 52 for mounting semiconductors according to the present embodiment, it becomes possible to form a semiconductor package 14 and a semiconductor package 20 as in the wiring substrate 5 for mounting semiconductors and the wiring substrate 29 for mounting semiconductors. Where a semiconductor device is mounted on both sides of the wiring substrate 52 for mounting semiconductors, a rigid material having a high resiliency ratio is chosen for the third insulation layer 43 in order to improve handling convenience, a material having a lower resiliency ratio is employed for the fourth insulation layer 46 in order to relieve the stress, and a material having a higher film strength or a lower thermal expansion ratio than the third insulation layer 43 and the fourth insulation layer 46 is employed for the first insulation layer 41 and the second insulation layer 42, whereby it is possible to form a wiring substrate 52 for mounting semiconductors that is able to prevent cracks from occurring, which come from the surface of the wiring substrate 52 for mounting semiconductors due to a difference in the thermal expansion ratio, and is able to bring about a stress relaxation feature.

Further, where the wiring substrate 52 for mounting semiconductors is mounted on the mother board with a semiconductor device mounted at the first insulation layer 41 side of the wiring substrate 52 for mounting semiconductors and with not only a semiconductor device but also soldering balls mounted at the second insulation layer 42 side, a rigid material having a high resiliency ratio is chosen for the third insulation layer 43 in order to improve handling convenience, a material having a lower thermal expansion ratio is employed for the fourth insulation layer 46, a material having a higher film strength than the third insulation layer 43 and the fourth insulation layer 46 is employed for the first insulation layer 41, and a material having a lower resiliency ratio than the third insulation layer 43 and the fourth insulation layer 46 is employed for the second insulation layer 42, wherein it is possible to form an optimal wiring substrate 52 for mounting semiconductors with respect to reliability by applying materials differing from each other in all the insulation layers.

Figure 10:
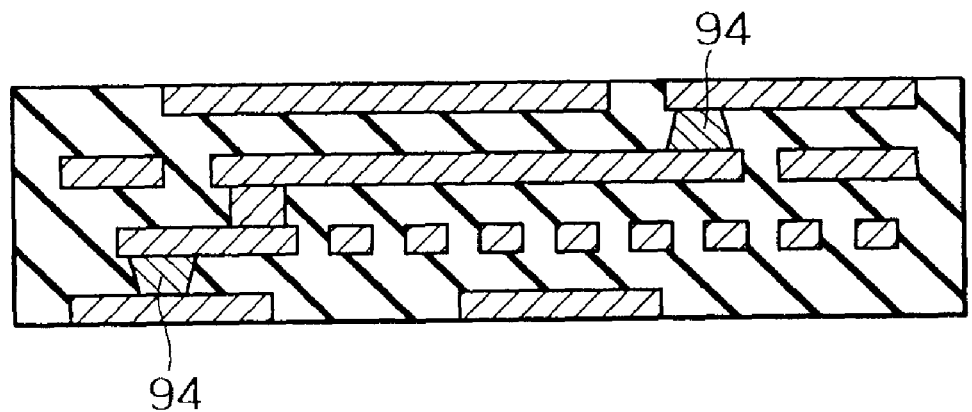
FIG. 10 is sectional views depicting a wiring substrate for mounting semiconductors according to a fourth embodiment of the present invention.
Figure 11:
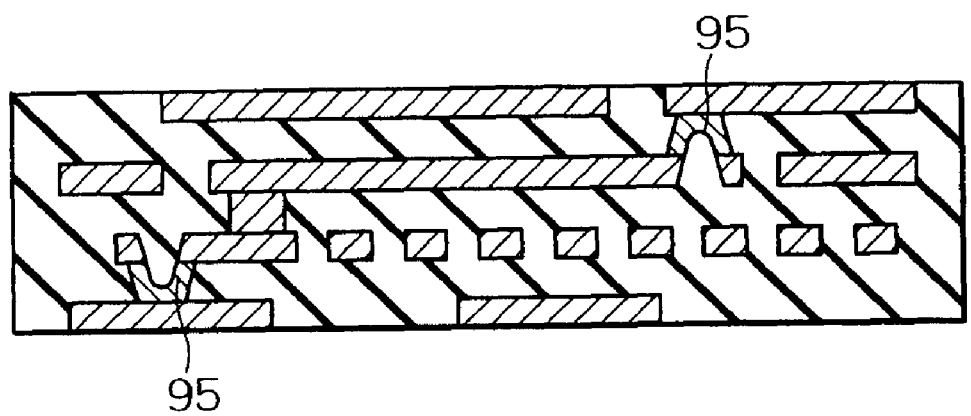
FIG. 11 is a sectional view depicting a wiring substrate for mounting semiconductors according to the fourth embodiment of the present invention.

Next, a description is given of a wiring substrate for mounting a semiconductor according to a fourth embodiment of the present invention with reference to FIG. 10 and FIG. 11. In the wiring substrate for mounting a semiconductor, the front surface side size of vias 94 and 95 formed in the first insulation layer are smaller than the rear surface side size thereof, and the rear surface side size of the vias 94 and 95 formed in the second insulation layer are smaller than the front surface side size thereof. A structure having such a via shape can be achieved by via formation, for example, by means of laser or by a photo via using a photosensitive resin.

Usually, in the laser irradiation step or light exposure step, a via size at the incident side of a laser or light differs from a via size at the side opposite thereto. Therefore, such a substrate can be achieved, which has vias in which the front surface side size of vias 94 and 95 formed in the first insulation layer is smaller than the rear surface side size thereof, and the rear surface side size of the vias 94 and 95 formed in the second insulation layer is smaller than the front surface side size thereof, and it is possible to form a substrate for which connection density with semiconductors can be increased.

Still, the sizes of the vias 94 and 95 denote the diameter at the upper part or the lower part of the vias if the via shape is a conical type. It is not necessary that the via shape is circular. In this case, an adequate amount such as the surrounding length may be defined as the size.

A via that composes a wiring substrate for mounting a semiconductor according to the present embodiment may be a filled via as depicted in FIG. 14, and may be a conformal via 95 as depicted in FIG. 15. In the case of the filled via 94, wiring can be located on the filled via 94, wherein since it becomes possible to design a wire and a pad so that the filled vias 94 are stacked. Accordingly, with freedom of wiring, an advantage will be brought about, by which the wiring density can be improved, and in the case of the filled via 94. On the hand, in the case of the conformal via 95, since the via has an effect for relieving the stress for the via, there is another advantage by which the reliability thereof under the condition with temperature cycles can be improved.

Also, the relationship between the front surface side size of the vias 94 and 95 and the rear surface side size thereof may be reversed for the relationship depicted in FIG. 10 and FIG. 11.

Various shapes of vias for constructing a wiring substrate according to the present invention may be chosen. For example, the shapes may be a cylindrical type in which the front surface side size of a via is the same as the rear surface side thereof, a barrel type in which the middle of a via is bulged, a hand-drum type in which the middle of a via is narrowed, a conical type, etc. A cylindrical type via has an advantage since it is simply formed by a drilling machine. Since the barrel type via has a bulged middle part, and the area of the upper and lower parts of the via are small although the electric resistance thereof is slight, the barrel type via has an advantage by which the wiring density of a wiring portion can be further increased than in the cylindrical type via. Since, in a hand-drum type via in which the middle thereof is narrowed, the area of the upper and lower parts being connection points with wires, the connection of which is generally weakened, is larger, the hand-drum type via has an advantage by which the reliability is improved. In a laser via which is formed by a laser beam and a photo via which is formed by light, the diameter of a via at the side into which a laser beam or light is made incident is generally liable to be increased. However, it is possible to suppress these shapes by varying the material, irradiation conditions of the laser beam, and exposure conditions thereof.

Figure 12A:
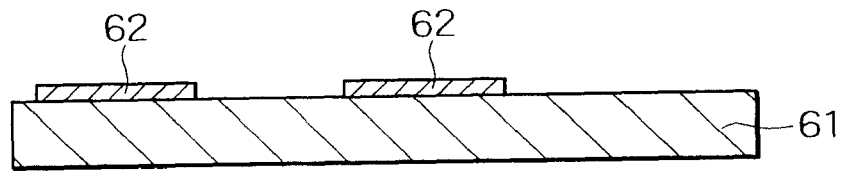
FIG. 12A through FIG. 12E are sectional views depicting a method of manufacturing a wiring substrate for mounting semiconductors according to a fifth embodiment of the present invention.
Figure 12B:
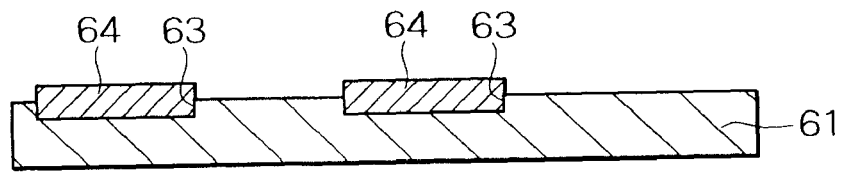
Figure 12C:
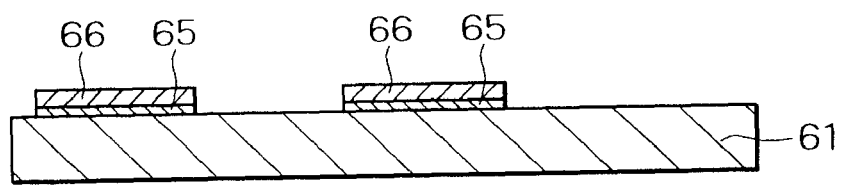

Next, a description is given of embodiments of a method of manufacturing a wiring substrate for mounting semiconductors according to the present invention. First, a description is given of a fifth embodiment of the present invention. FIG. 12A through FIG. 12E and FIG. 13A through FIG. 13C are sectional views depicting a method of manufacturing a wiring substrate for mounting semiconductors according to the present embodiment in the order of processes. As depicted in FIG. 12A, first, a conductive layer that becomes electrode pads 62 is formed on a support substrate 61 by, for example, a plating method. In this time, as depicted in FIG. 12B, recesses 63 may be formed in the support substrate 61 by etching, and conductive layers may be buried in the recesses. Therefore, electrode pads 64 partially buried in the surface of the support substrate 61 can be formed. Also, as depicted in FIG. 12C, barrier layers 65 may be provided on the support substrate 61, and conductive layers may be next formed on the barrier layers 65. Therefore electrode pads 66 of a double structure including the barrier layer 65 can be formed.

Figure 12D:
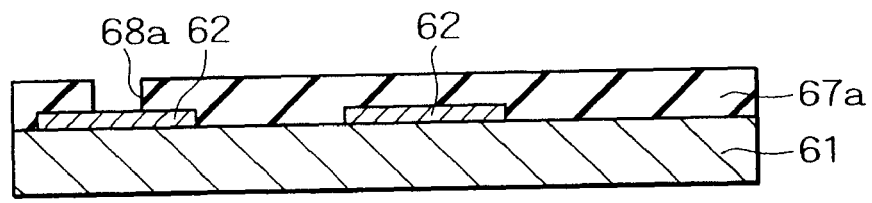
Figure 12E:
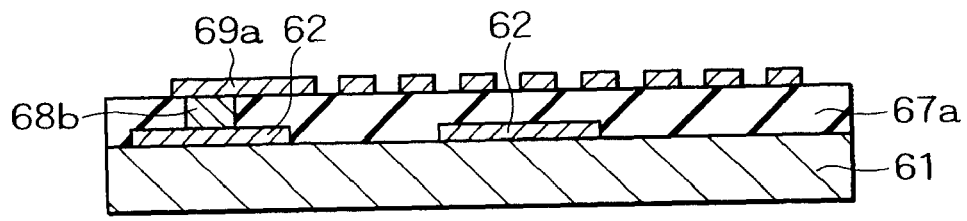

Next, as depicted in FIG. 12D, an insulation layer 67a is formed on the support substrate 61 which conductive layers 62, 64 or 66 are formed on as described above, and further a via hole 68a is formed in the insulation layer 67a. After that, as depicted in FIG. 12E, a wire 69a is formed on the insulation layer 67a, whereby the via hole 68a is filled with a conductive material, and a via 68b for connecting the electrode pad 62 and wire 69a to each other is thus formed.

Figure 13A:
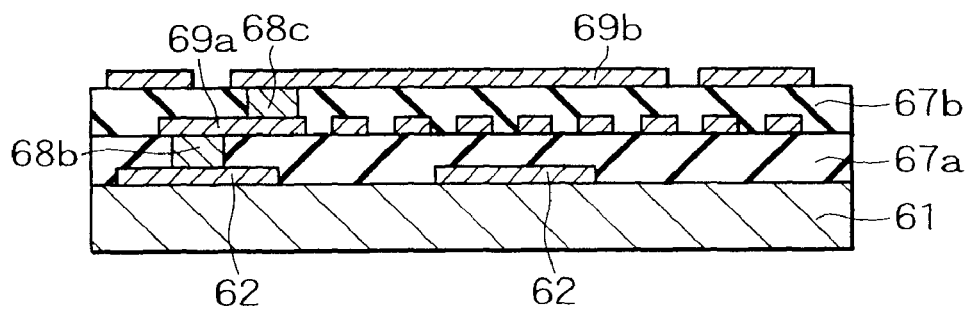
FIG. 13A through FIG. 13C are sectional views depicting a method of manufacturing a wiring substrate for mounting semiconductors according to a fifth embodiment of the present invention, which show the steps next to those depicted in FIG. 12E.

Also, as necessary, as depicted in FIG. 13A, multi-layers of wiring can be achieved by forming the insulation layer 67b on the insulation layer 67a, forming a via 68c in the insulation layer 67b and forming a wire 69b on the insulation layer 67b. Further, by repeating the step, further multi-layers can be achieved to a necessary number of layers.

Figure 13B:
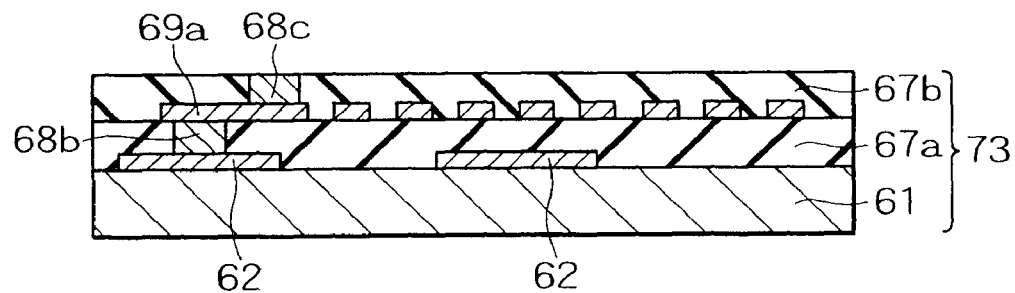

Subsequently, as shown in FIG. 13B, a wiring substrate 73 having a support substrate, the insulation layers 67a and 67b is formed by polishing and removing the uppermost surface wiring 69b. Still, when forming the via 68c, it is possible to form the via 68c by forming the wire 69b and filling a conductive material in a via hole. The forming method is not limited thereto. The via 68c may be formed only by filling the conductive material in the via hole.

Figure 13C:
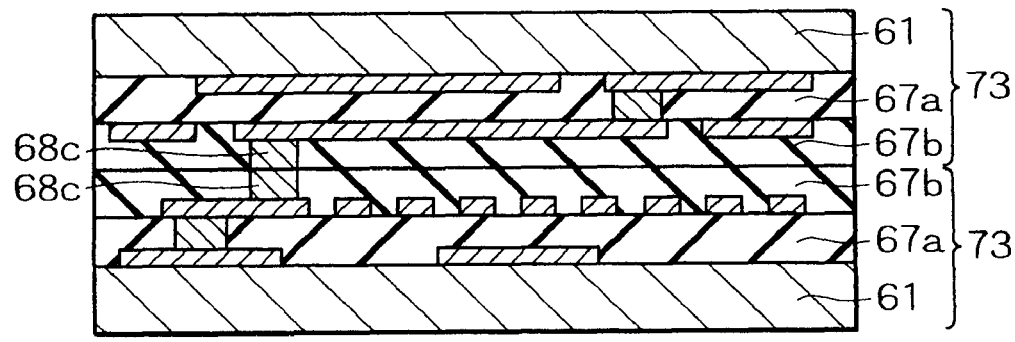

Next, as depicted in FIG. 13C, the two wiring substrates 73 each having the support substrate are overlapped so as for the insulation layers 67b to be brought into contact with each other, and are adhered to each other so that the vias 68c exposed on the surface of the insulation layer 67b are faced to each other.

Figure 14A:
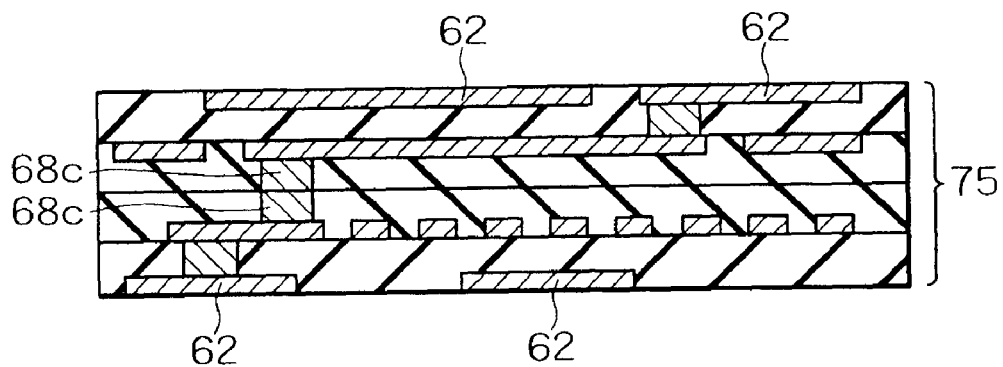
FIG. 14A through FIG. 14C are sectional views depicting a method of manufacturing a wiring substrate for mounting semiconductors according to the fifth embodiment, in the order of processes, which show the steps next to those depicted in FIG. 13E.

Thereafter, if both the support substrates 61 are all removed by etching, etc., as depicted in FIG. 14A, it is possible to obtain a wiring substrate 75 for mounting semiconductors having the electrode pads 62 exposed on both of the front surface and the rear surface thereof and internally having a multi-layered wiring substrate.

Figure 14B:
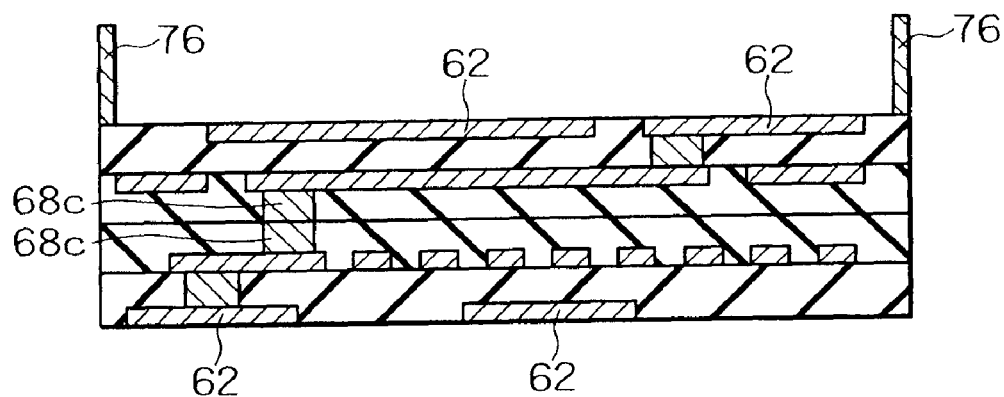
Figure 14C:
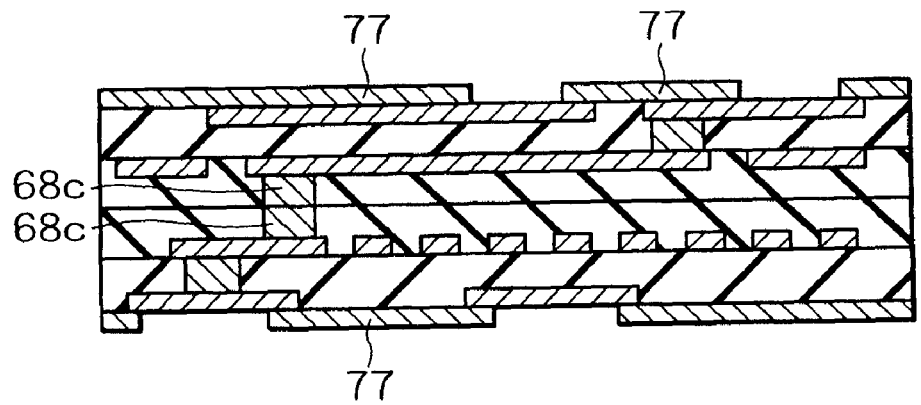

Also, as depicted in FIG. 14B, if a part of the support substrate 61 is left over and is made into a support body 76, it is possible to obtain a wiring substrate 75 for mounting semiconductors in which the support body 76 is provided. Further, if necessary, as depicted in FIG. 14C, a solder resist layer 77 may be formed at optional positions on both sides of the wiring substrate 75 for mounting semiconductors.

There is no special limitation with respect to the material of the support substrate 61. If it is taken into consideration that the material is finally removed, a material having a satisfactory working property is preferred. As a specific material of the support substrate 61, a metal such as copper, copper alloy, stainless steel, aluminum, etc., or a material such as glass, silicon, etc., is preferred. Also, it is preferable that the material of the vias 68c is such that it is securely welded and connected to vias 68c by heat and pressure for adhering the wiring substrates 73 with a support substrate to each other. In detail, it is preferable that the conductive material for the vias 68c is conductive paste having metallic particles dispersed in resin, or solder, etc. In addition, with respect to the insulation layers 67a and 67b, although a heat resisting property and a chemical resisting property, etc., are made necessary in terms of production process, it is possible to choose an optional material if there is no problem in the above-described point.

In the method of manufacturing a wiring substrate for mounting semiconductors, described above as shown in FIG. 13C, since two of the wiring substrates 73 with a support substrate, in which insulation layers and wires are formed on the support substrate 61 having excellent dimensional stability, are adhered to each other in a face-to-face state, as depicted in FIG. 14A, it is possible to obtain the wiring substrate 75 for mounting semiconductors, having high density and high accuracy, in which the positional accuracy of the electrode pads 62 is satisfactory. Further, since both surfaces to be adhered to each other in a face-to-face state have the insulation layers 67b formed on the wires 69a and are flattened, it is not necessary to adhere both the surfaces by deforming the insulation layers 67b by heating and pressurizing. Therefore, it is possible to adhere the same at a remarkably low temperature and a remarkably low pressurizing force. For this reason, when adhering, the entirety of the wiring substrate 73 with a support substrate does not have any distortion, wherein it is possible to obtain a wiring substrate 75 for mounting semiconductors, which has excellent reliability.

Figure 15A:
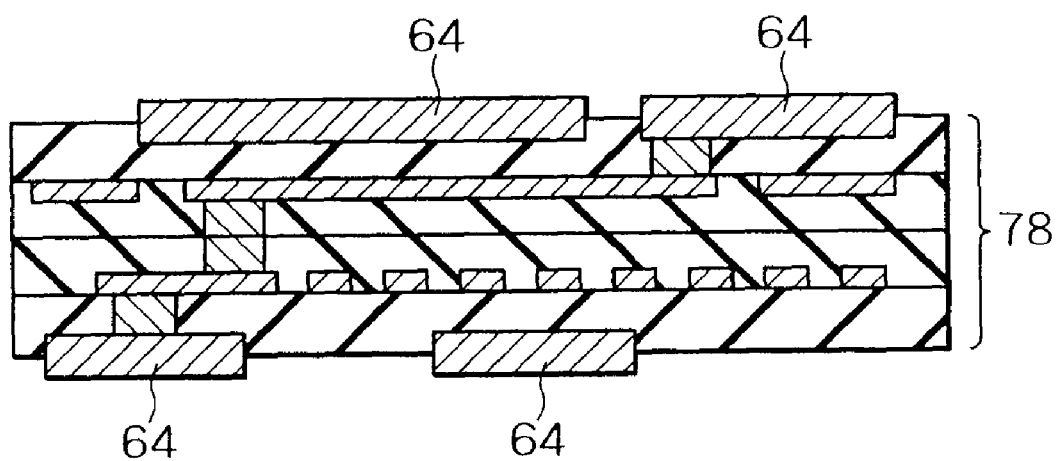
FIG. 15A through FIG. 15B are sectional views depicting a method of manufacturing a wiring substrate for mounting semiconductors according to the fifth embodiment.

Also, as depicted in FIG. 12B, in a case where a recess 63 is formed in the support substrate 61 in advance by etching, a conductive layer is filled in the recess 63, and an electrode pad 64 is formed, it is possible to obtain, as depicted in FIG. 15A, a wiring substrate for mounting semiconductors, in which the exposed surface of the electrode pad 64 protrudes from the front surface or the rear surface of the insulation layer 78, by removing a part or the entirety of the support substrate 61.

Figure 15B:
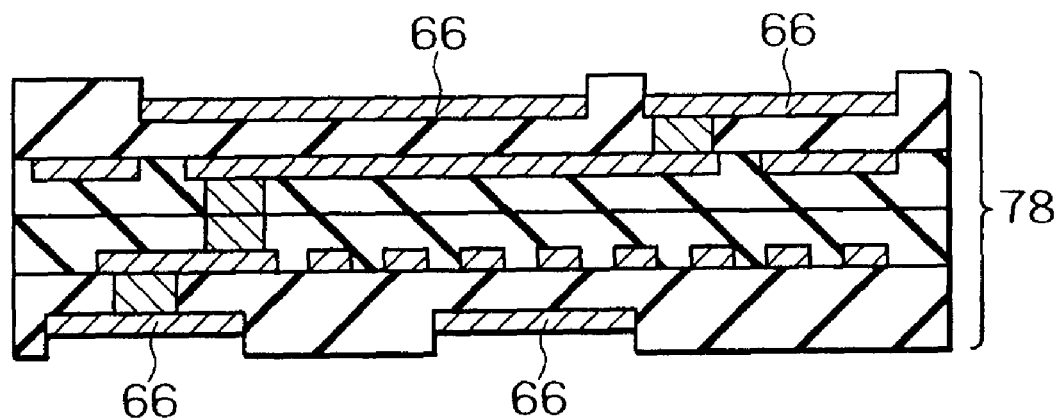

On the other hand, as shown in FIG. 12C, where the electrode pads 66 are formed by providing a barrier layer 65 in advance on the support substrate 61 and laminating a conductive layer on the barrier layer 65, it is possible to obtain a wiring substrate for mounting semiconductors, in which the exposed surfaces of the electrode pads 66 are made concave from the front surface or the rear surface of the insulation layer 78 as shown in FIG. 15B, by removing the entirety or a part of the support substrate 61 and further removing the barrier layer 65.

Next, a description is given of a sixth embodiment of the present invention with reference to FIG. 16A through FIG. 16I. FIG. 16A through FIG. 16I are sectional views depicting a method of manufacturing a wiring substrate for mounting a semiconductor according to the sixth embodiment in the order of steps. In the method, as depicted in FIG. 16A, an underlayered insulation layer 93 is first formed on the support substrate 61. As depicted in FIG. 16B, a conductive layer that becomes an electrode pad 62 is formed on the underlayered insulation layer 93. Thereafter, as depicted in FIG. 16C through FIG. 16I, a wiring layer, etc., is formed as in the first embodiment depicted in FIG. 7, and two substrates are adhered to each other. After that, the support substrates are removed. FIG. 16H depicts a state where the support substrates are removed. After that, as depicted in FIG. 16I, an opening is formed in the underlayered insulation layer 93 first formed on the support substrate 61 in order to expose the electrode pad 62. Laser or dry etching may be employed for formation of the opening.

Next, a description is given of a seventh embodiment of the present invention. FIG. 17A through FIG. 17D and FIG. 18A through FIG. 18C are sectional views depicting a method of manufacturing a wiring substrate for mounting semiconductors according to the fifth embodiment in the order of steps.

Figure 17A:
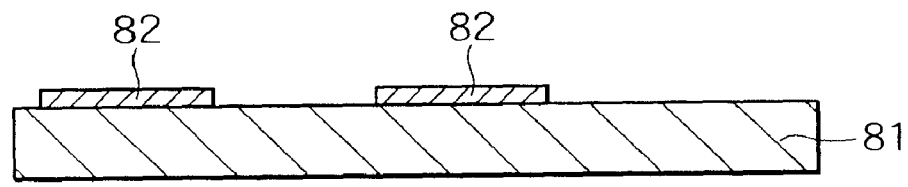
FIG. 17A through FIG. 17D are sectional views depicting a method of manufacturing a wiring substrate for mounting a semiconductor according to a seventh embodiment of the present invention in the order of the steps thereof.

First, as depicted in FIG. 17A, electrode pads 82 are formed by forming a pattern of a conductive layer on a support substrate 81. Also, as described above, a recess may be formed in the support substrate 81 in advance by etching, and a conductive layer is formed so as to be filled in the recess. And, as described later, electrode pads having its exposed surface protruded from the front surface or the rear surface of the insulation film can be formed by finally removing the entirety or a part of the support substrate 81. Further, a barrier layer may be formed in advance on the support substrate 81, and, a conductive layer which becomes an electrode pad 82 is formed, wherein it is possible to form an electrode pad having its exposed surface located at a position recessed from the front surface or the rear surface of the insulation film, by removing the entirety or a part of the support substrate 81 and further removing the barrier layer. Hereinafter, a description is given of a case where the electrode pads 82 are formed on the supporting substrate 81 depicted in FIG. 17A.

Figure 17B:
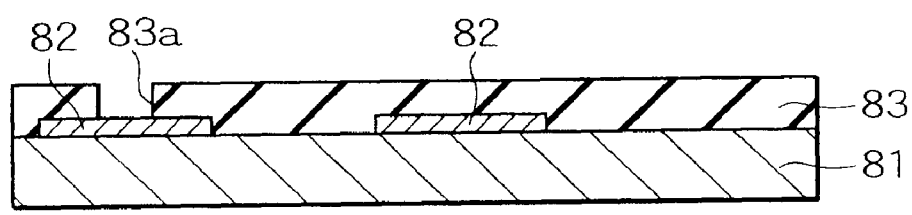

Next, as depicted in FIG. 17B, an insulation layer 83 is formed on the support substrate 81, and further a via hole 83a reaching the electrode pad 82 is formed in the insulation layer 83.

Figure 17C:
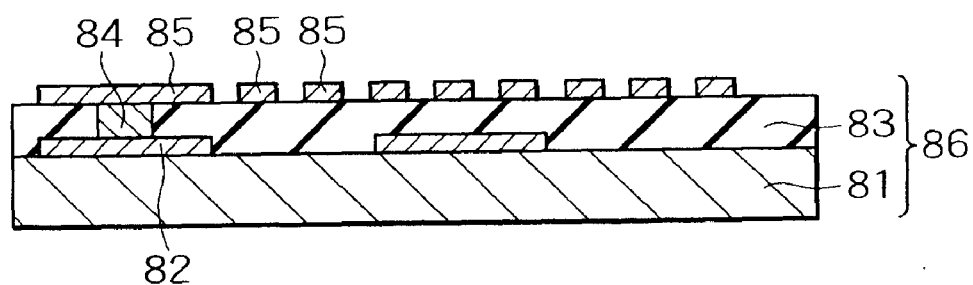

Subsequently, as depicted in FIG. 17C, wires 85 are formed on the insulation layer 83. In this case, a conductive material of the wires 85 is filled in the via hole 83a, thereby forming a via 84 by which the wires 85 are connected to the electrode pads 82. Therefore, a wiring substrate 86 with a support substrate can be brought about.

Figure 17D:
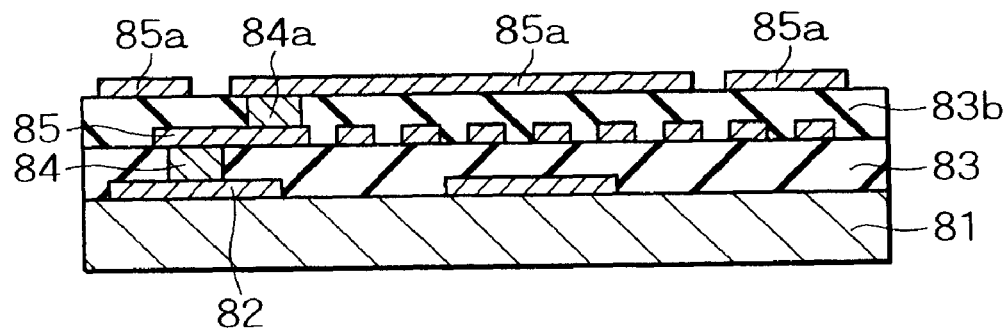

Also, as necessary, as shown in FIG. 17D, an insulation layer 83b is formed on the wires 85 and the insulation layer 83, and the wires 85a are formed on the insulation layer 83b. At this time, a via 84a is formed in the insulation layer 83b. By repeating the step for forming such an insulation layer, wires and a via, a wiring substrate 86 with a support substrate, which is wired in multi-layers, can be brought about.

Figure 18A:
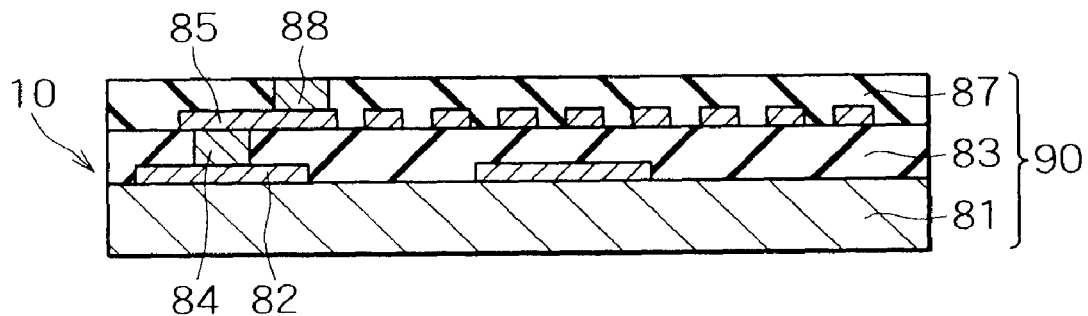
FIG. 18A through FIG. 18C are sectional views depicting a method of manufacturing a wiring substrate for mounting a semiconductor according to the seventh embodiment of the present invention in the order of the steps thereof, which shows the steps next to those depicted in FIG. 17D.

Next, an insulation layer 87 is formed, as depicted in FIG. 18A, on the wiring substrate 86 with a support substrate depicted in FIG. 17C, and a via hole is formed in the insulation layer 87. Further, a via 88 is formed by filling a conductive material in the via hole, whereby a wiring substrate 90 with a support substrate, which has the via 88, can be brought about. As the conductive material, conductive paste or solder may be used.

Figure 18B:
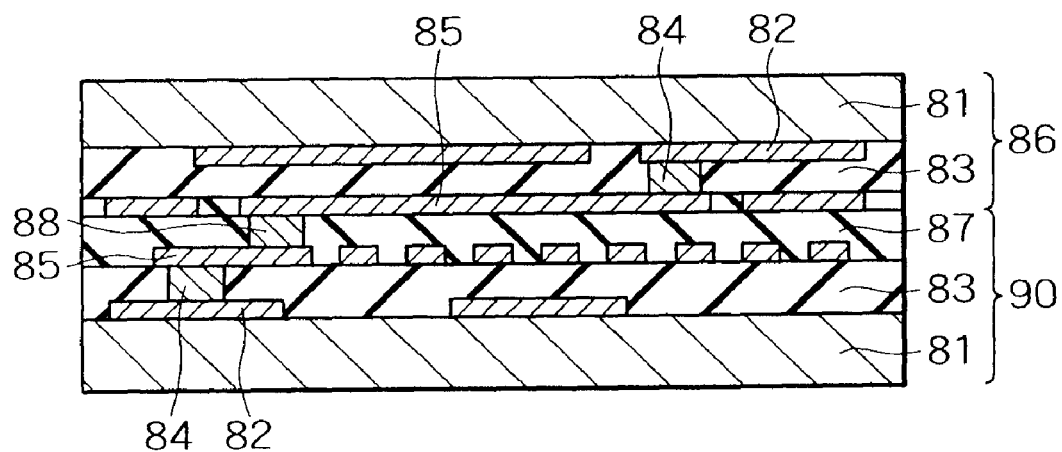

Next, as depicted in FIG. 18B, the wiring substrate 86 with a support substrate depicted in FIG. 17C and the wiring substrate 90 with a support substrate depicted in FIG. 18A are adhered to each other in a face-to-face state.

Figure 18C:
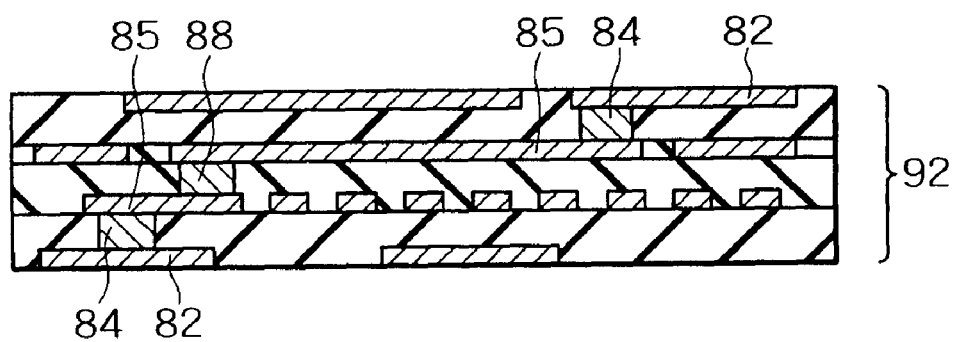

Next, as depicted in FIG. 18C, if the electrode pads 82 are exposed by removing the entirety of the support substrate 81, a wiring substrate 92 for mounting semiconductors can be obtained.

In addition, as necessary, as depicted in FIG. 14B, a part of the support substrate 81 is left over by removing not the entirety of the support substrate 81 but a part thereof, wherein a wiring substrate 92 for mounting semiconductors, having a support body (support body 76), can be brought about. Furthermore, as depicted in FIG. 14C, a solder resist layer (solder resist layer 77) may be formed at optional positions on both the sides of the wiring substrate 92 for mounting semiconductors.

In the method of manufacturing a wiring substrate for mounting semiconductors according to the present embodiment, which is described above, accuracy may be slightly lowered when adhering the wiring substrates 86 with a support substrate to each other since the surface thereof is not flat. However, there is an advantage in that the number of steps is reduced and production costs can be reduced, since only one of the wiring substrates 90 with a support substrate is formed.

However, in order to adhere the wiring substrates 90 with a support substrate and the wiring substrate 86 with a support substrate to each other in a face-to-face state under conditions which are appropriately low temperature and low pressure, characteristics of the insulation layer 87 are important. A heat-curing resin which has a lower curing temperature in comparison with the insulation layer 83 and easily flows with heat and pressure for lamination may be employed as the insulation layer 87. In detail, epoxy resin and denatured polyimide may be listed. Actually, however, epoxy resin including an elastomer constituent is preferred. By applying such materials to the insulation layer 87, it is possible to obtain a wiring substrate 92 for mounting semiconductors, which is produced at low cost and has excellent reliability.

As described in detail above, according to the respective embodiments, with respect to a wiring substrate having at least an insulation film, wires formed in the insulation film, and a plurality of electrode pads which electrically connect to the wires, a novel wiring substrate for mounting semiconductors, which is excellent in reliability, can brought about, and the wiring substrate is effective for an increase in terminals and narrowing of pitches in line with high integration, high speed and multi-functioning of semiconductor devices and is capable of mounting semiconductor devices at high density and high accuracy on both sides thereof since the electrode pads are provided on the front surface and the rear surface of the insulation film with the surfaces thereof exposed, and at least a part of the side surface of the electrode pads is buried in the insulation film.

What is claimed is:

1. A method of manufacturing a wiring substrate for mounting semiconductors comprising:
    forming two wiring substrates with a support substrate, said forming each of said wiring substrates with a support substrate comprising:
        forming a conductive layer comprising a plurality of sectioned conductive layers on said support substrate;
        forming an insulation layer on said conductive layer;
        forming one or more intermediate layers on said insulation layer, said forming each of intermediate layers comprising:
            forming vias in said insulation layer;
            forming a wiring on said insulation layer; and
            forming other insulation layer on said wiring;
        forming via holes in said intermediate layer that is made into an uppermost surface of said one or more intermediate layer; and
        filling a conductor in the via holes to form vias;
    adhering said intermediate layers, which are overlapped contacting each other forming an uppermost surface of said two wiring substrates with a support substrate, to each other in a face-to-face state; and
    removing a part or the entirety of said support substrates to expose the conductive layer so the plurality of sectioned conductive layers become electrode pads.

2. The method of manufacturing a wiring substrate for mounting a semiconductor according to claim 1, further comprising forming an underlayered insulation layer on said support substrate before said forming said conductive layer.

3. The method of manufacturing a wiring substrate for mounting a semiconductor according to claim 2, further comprising forming an opening in the part of said underlayered insulation layer located on at least one or more parts of said conductive layer which become electrode pads after said removing a part or the entirety of said support substrate.

4. The method of manufacturing a wiring substrate for mounting a semiconductor according to claim 3, wherein said opening is formed by laser or dry etching.

5. The method of manufacturing a wiring substrate for mounting semiconductors according to claim 1, wherein said conductor is conductive paste or solder.

6. The method of manufacturing a wiring substrate for mounting a semiconductor according to claim 1, wherein said support substrate provided with a thin film metal layer and a thicker support metal layer than said thin film metal layer is employed as said support substrate.

7. A method of manufacturing a wiring substrate for mounting semiconductors comprising:
    forming two wiring substrates with a support substrate, said forming each of said wiring substrates with a support substrate comprising:
        forming a conductive layer comprising a plurality of separated conductive layers on said support substrate;
        forming an insulation layer on said conductive layer;
        forming one or more intermediate layers on said insulation layer, said forming each of intermediate layers comprising:
            forming vias in said insulation layer;
            forming a wiring on said insulation layer; and
            forming other insulation layer on said wiring;
        forming via holes in said intermediate layer that is made into an uppermost surface of said one or more intermediate layer;
        filling a conductor in the via holes to form vias; and
        forming a wiring on said insulation layer that is made into an uppermost surface;
    adhering said intermediate layers, which are overlapped contacting each other forming an uppermost surface of said two wiring substrates with a support substrate, to each other in a face-to-face state; and
    removing a part or the entirety of said support substrates to expose the conductive layer so the plurality of separated conductive layers become electrode pads.

8. The method of manufacturing a wiring substrate for mounting a semiconductor according to claim 7, further comprising forming an underlayered insulation layer on said support substrate before said forming said conductive layer.

9. The method of manufacturing a wiring substrate for mounting a semiconductor according to claim 8, further comprising forming an opening in the part of said underlayered insulation layer located on at least one or more parts of said conductive layer which become electrode pads after said removing a part or the entirety of said support substrate.

10. The method of manufacturing a wiring substrate for mounting a semiconductor according to claim 9, wherein said opening is formed by laser or dry etching.

11. The method of manufacturing a wiring substrate for mounting semiconductors according to claim 7, wherein said conductor is conductive paste or solder.

12. The method of manufacturing a wiring substrate for mounting a semiconductor according to claim 7, wherein said support substrate provided with a thin film metal layer and a thicker support metal layer than said thin film metal layer is employed as said support substrate.

* * * * *